(12) United States Patent
Chiang

(10) Patent No.: US 6,891,276 B1
(45) Date of Patent: May 10, 2005

(54) SEMICONDUCTOR PACKAGE DEVICE

(75) Inventor: Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 51 days.

(21) Appl. No.: 10/042,812

(22) Filed: Jan. 9, 2002

(51) Int. Cl.$^7$ .............................................. H01L 23/31
(52) U.S. Cl. ....................... 257/790; 257/676; 257/730; 257/789; 257/790
(58) Field of Search ................................. 257/666, 668, 257/676, 729–733, 735, 736, 748, 749, 787, 788–795

(56) References Cited

U.S. PATENT DOCUMENTS

| | | | | |
|---|---|---|---|---|
| 3,627,901 A | * | 12/1971 | Happ | ........................... 257/666 |
| 3,678,385 A | * | 7/1972 | Bruner | ........................ 324/754 |
| 3,930,114 A | * | 12/1975 | Hodge | ........................ 174/52.4 |
| 4,506,238 A | * | 3/1985 | Endoh et al. | ................ 333/138 |
| 4,971,930 A | | 11/1990 | Fusaroli et al. | ............. 437/217 |
| 5,081,520 A | | 1/1992 | Yoshii et al. | ................... 357/80 |
| 5,149,958 A | | 9/1992 | Hallenbeck et al. | ......... 250/216 |
| 5,157,480 A | * | 10/1992 | McShane et al. | ............ 257/693 |
| 5,207,102 A | * | 5/1993 | Takahashi et al. | ............. 73/727 |
| 5,241,133 A | | 8/1993 | Mullen, III et al. | ........ 174/52.4 |
| 5,264,714 A | * | 11/1993 | Nakaya et al. | .................. 257/78 |
| 5,394,303 A | | 2/1995 | Yamaji | ........................ 361/749 |
| 5,405,809 A | * | 4/1995 | Nakamura et al. | ............. 438/64 |
| 5,436,500 A | * | 7/1995 | Park et al. | ................... 257/696 |
| 5,440,231 A | | 8/1995 | Sugai | ....................... 324/158.1 |
| 5,530,282 A | | 6/1996 | Tsuji | ........................... 257/666 |
| 5,665,652 A | | 9/1997 | Shimizu | ...................... 438/127 |
| 5,674,785 A | | 10/1997 | Akram et al. | ................. 437/217 |
| 5,677,566 A | * | 10/1997 | King et al. | ................... 257/666 |
| 5,744,827 A | | 4/1998 | Jeong et al. | .................. 257/686 |
| 5,744,859 A | | 4/1998 | Ouchida | ...................... 257/668 |
| 5,804,771 A | | 9/1998 | McMahon et al. | ........... 174/255 |
| 5,811,879 A | | 9/1998 | Akram | ......................... 257/723 |
| 5,834,835 A | | 11/1998 | Maekawa | ..................... 257/680 |
| 5,834,843 A | | 11/1998 | Mori et al. | ................... 257/723 |
| 5,859,471 A | * | 1/1999 | Kuraishi et al. | ............. 257/666 |
| 5,866,939 A | * | 2/1999 | Shin et al. | ................... 257/666 |

(Continued)

FOREIGN PATENT DOCUMENTS

| | | | | |
|---|---|---|---|---|
| JP | 57100761 | | 6/1982 | ........... H01L/27/14 |
| JP | 01128897 A | * | 5/1989 | |
| JP | 06097352 A | * | 4/1994 | |

OTHER PUBLICATIONS

Crowley, "Socket Developments for CSP and FBGA Packages," Chip Scale Review, May 1998, pp. 37–40.

Forster, "Socket Challenges for Chip–Scale Packages," Chip Scale Review, May 1998, pp. 43–47.

Amagai, "Chip–Scale Packages for Center–Pad Memory Devices," Chip Scale Review, May 1998, pp. 68–77.

(Continued)

*Primary Examiner*—B. William Baumeister
*Assistant Examiner*—Chris Chu
(74) *Attorney, Agent, or Firm*—David M. Sigmond

(57) ABSTRACT

A semiconductor package device includes an insulative housing, a semiconductor chip, a terminal and a lead, wherein the insulative housing includes a top surface, a bottom surface, and a peripheral side surface between the top and bottom surfaces, the chip includes a conductive pad, the terminal protrudes downwardly from and extends through the bottom surface and is electrically connected to the pad, the lead protrudes laterally from and extends through the side surface and is electrically connected to the pad, the terminal and the lead are spaced and separated from one another outside the insulative housing, and the terminal and the lead are electrically connected to one another inside the insulative housing and outside the chip.

120 Claims, 29 Drawing Sheets

U.S. PATENT DOCUMENTS

| | | | | |
|---|---|---|---|---|
| 5,893,723 | A | | 4/1999 | Yamanaka .................... 438/65 |
| 5,894,107 | A | * | 4/1999 | Lee et al. ................... 174/52.2 |
| 5,949,135 | A | * | 9/1999 | Washida et al. ............ 257/685 |
| 5,949,655 | A | | 9/1999 | Glenn ......................... 361/783 |
| 5,951,804 | A | * | 9/1999 | Kweon et al. ......... 156/244.12 |
| 5,973,388 | A | * | 10/1999 | Chew et al. ................ 257/676 |
| 6,001,671 | A | | 12/1999 | Fjelstad ....................... 438/112 |
| 6,013,877 | A | | 1/2000 | Degani et al. .............. 174/264 |
| 6,025,650 | A | | 2/2000 | Tsuji et al. .................. 257/786 |
| 6,114,770 | A | * | 9/2000 | Akram et al. ............... 257/784 |
| 6,130,116 | A | * | 10/2000 | Smith et al. ................. 438/127 |
| 6,143,588 | A | | 11/2000 | Glenn ......................... 438/116 |
| 6,159,770 | A | | 12/2000 | Tetaka et al. ............... 438/112 |
| 6,198,171 | B1 | * | 3/2001 | Huang et al. ................ 257/787 |
| 6,218,728 | B1 | * | 4/2001 | Kimura ....................... 257/693 |
| 6,232,152 | B1 | * | 5/2001 | DiStefano et al. .......... 438/124 |
| 6,265,770 | B1 | | 7/2001 | Uchiyama ................... 257/698 |
| 6,274,927 | B1 | | 8/2001 | Glenn ......................... 257/680 |
| 6,281,568 | B1 | | 8/2001 | Glenn et al. ................ 257/684 |
| 6,297,543 | B1 | * | 10/2001 | Hong et al. ................. 257/666 |
| 6,303,997 | B1 | * | 10/2001 | Lee ............................. 257/778 |
| 6,326,700 | B1 | * | 12/2001 | Bai et al. ..................... 257/790 |
| 6,353,265 | B1 | | 3/2002 | Michii ........................ 257/777 |
| 6,369,595 | B1 | | 4/2002 | Farnworth et al. .......... 324/755 |
| 6,445,077 | B1 | * | 9/2002 | Choi et al. .................. 257/786 |
| 6,455,356 | B1 | * | 9/2002 | Glenn et al. ................ 438/123 |
| 6,468,836 | B1 | * | 10/2002 | Distefano et al. ........... 438/128 |
| 6,512,219 | B1 | | 1/2003 | Webster et al. .......... 250/208.1 |

OTHER PUBLICATIONS

Vandevelde et al., "The PSGA, a Lead–Free CSP for High Performance & High Reliable Packaging," Proceedings of the 2001 International Symposium on Microelectronics, Oct. 9, 2001, pp. 260–265.

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,733, filed May 24, 2001, entitled "Semiconductor Chip Assembly With Ball Bond Connection Joint".

U.S. Appl. No. 09/878,649 filed Jun. 11, 2001, entitled "Method of Making a Semiconductor Chip Assembly with a Conductive Trace Subtractively Formed Before and After Chip Attachment".

U.S. Appl. No. 09/878,626 filed Jun. 11, 2001, entitled "Method of Connecting a Conductive Trace to a Semiconductor Chip".

U.S. Appl. No. 09/917,339 filed Jul. 27, 2001, entitled "Method of Connecting a Bumped Compliant Conductive Trace to a Semiconductor Chip".

U.S. Appl. No. 09/927,216 filed Aug. 10, 2001, entitled "Semiconductor Chip Assembly with Hardened Connection Joint".

U.S. Appl. No. 09/939,140 filed Aug. 24, 2001, entitled "Semiconductor Chip Assembly with Interlock conductive Trace".

U.S. Appl. No. 09/962,754 filed Sep. 24, 2001, entitled "Method of Connecting a Conductive Trace and an Insulative Base to a Semiconductor Chip".

U.S. Appl. No. 09/972,796 filed Oct. 6, 2001, entitled "Method of Connecting a Bumped Compliant Conductive Trace and an Insulative Base to a Semiconductor Chip".

U.S. Appl. No. 09/997,973 filed Nov. 29, 2001, entitled "Method of Connecting a Bumped Conductive Trace to a Semiconductor Chip".

* cited by examiner

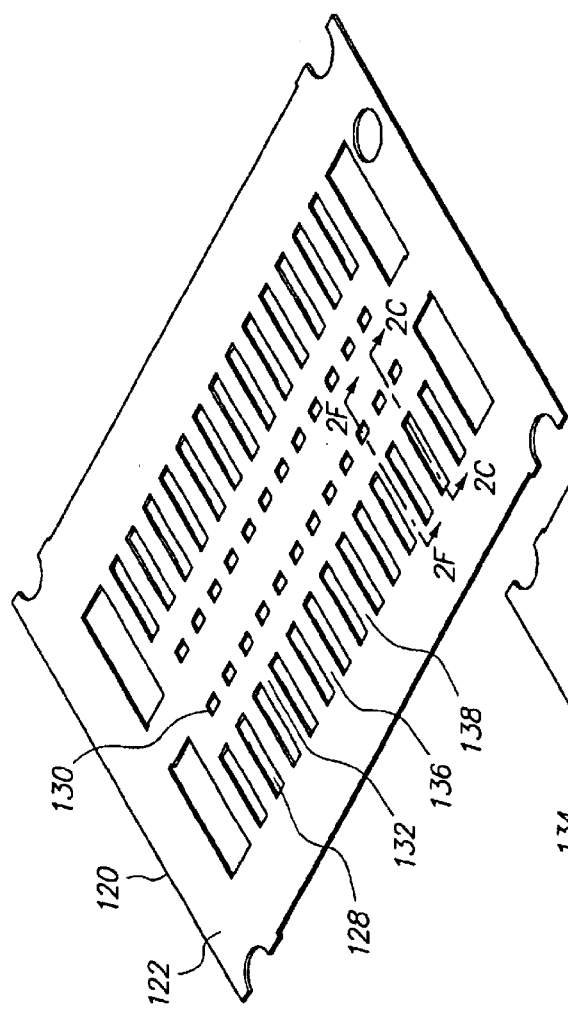
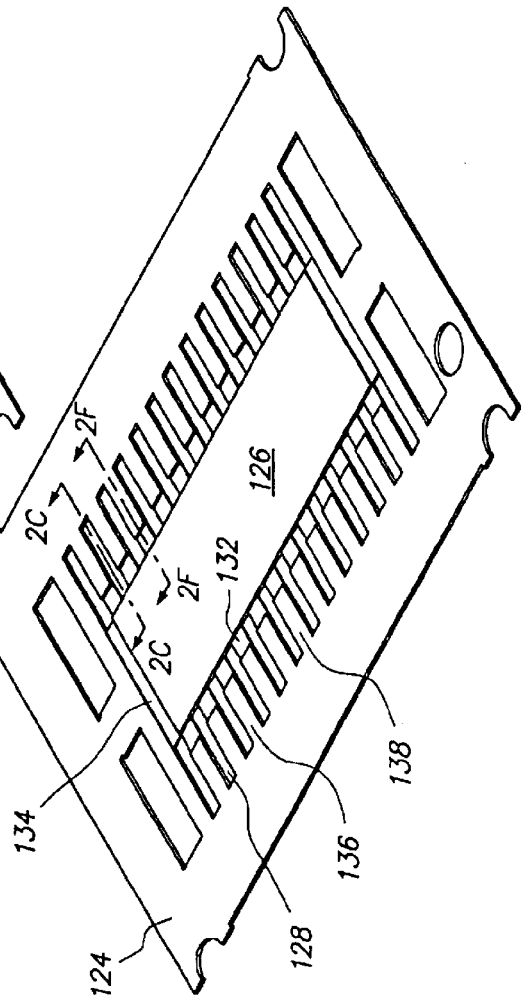
FIG. 2A
FIG. 2B

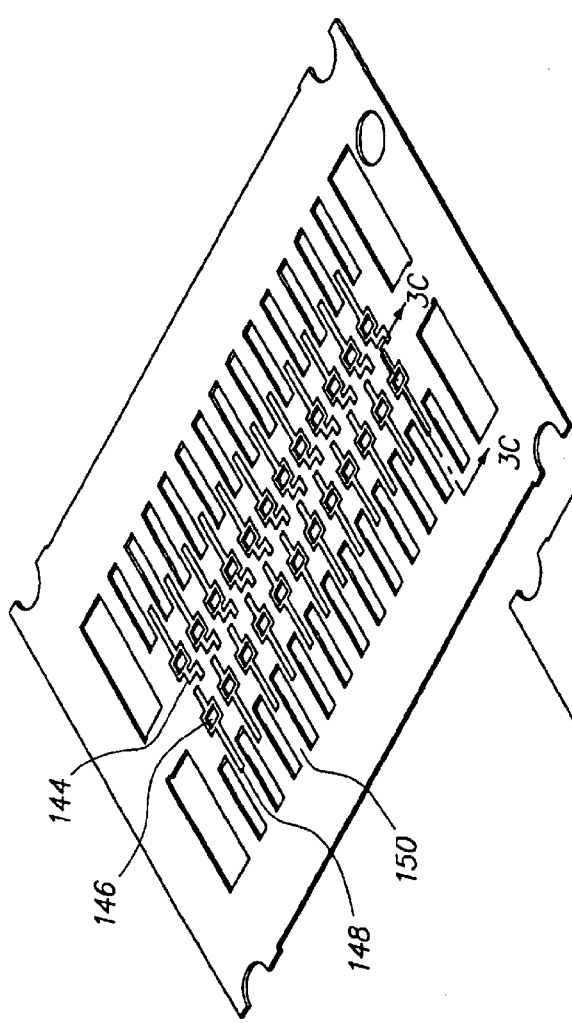
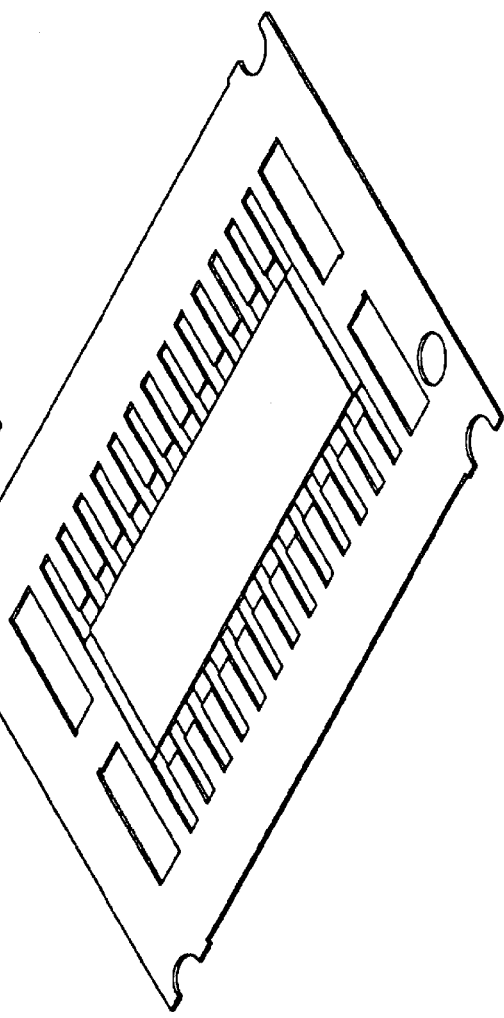

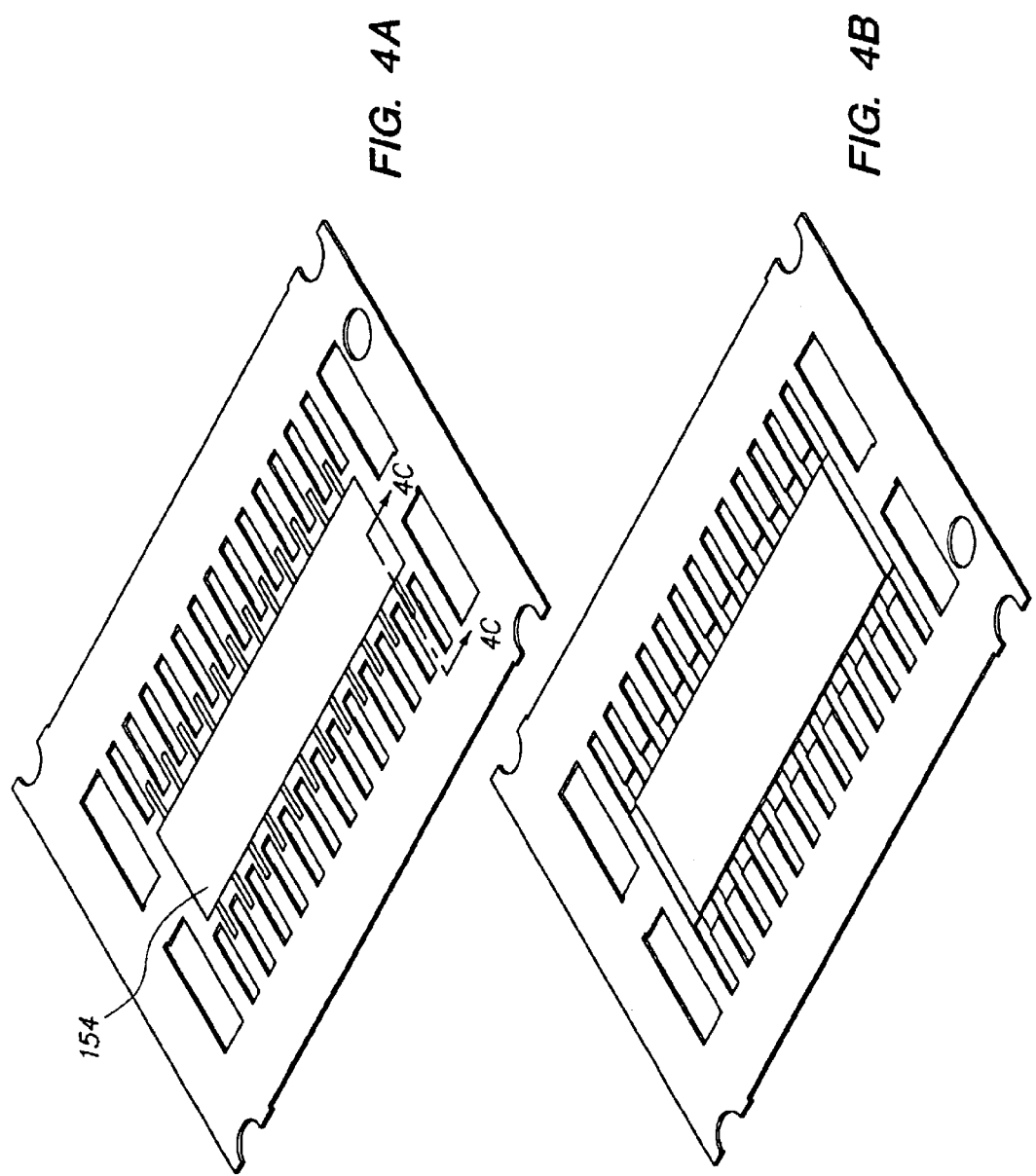

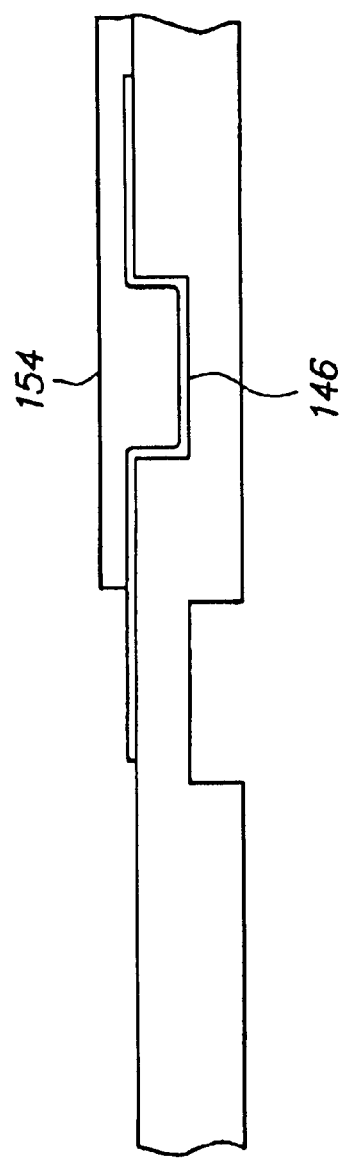

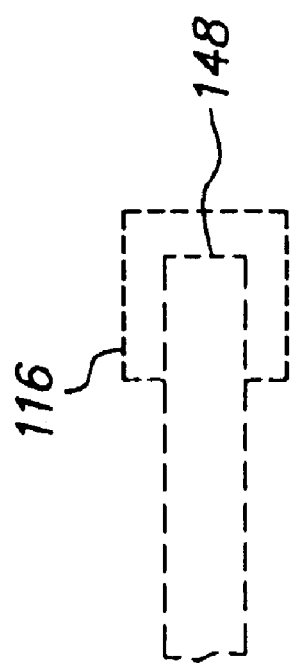

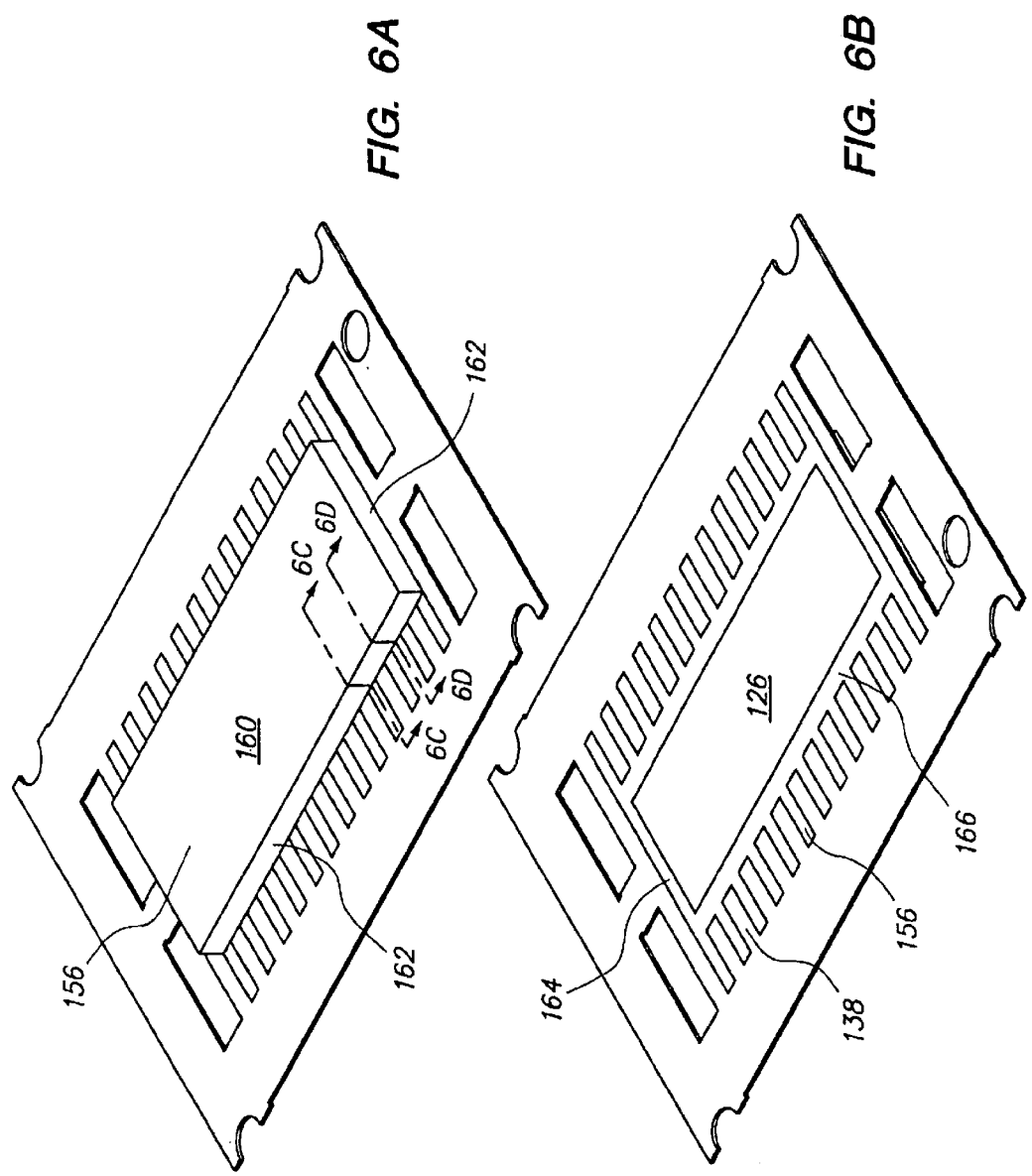

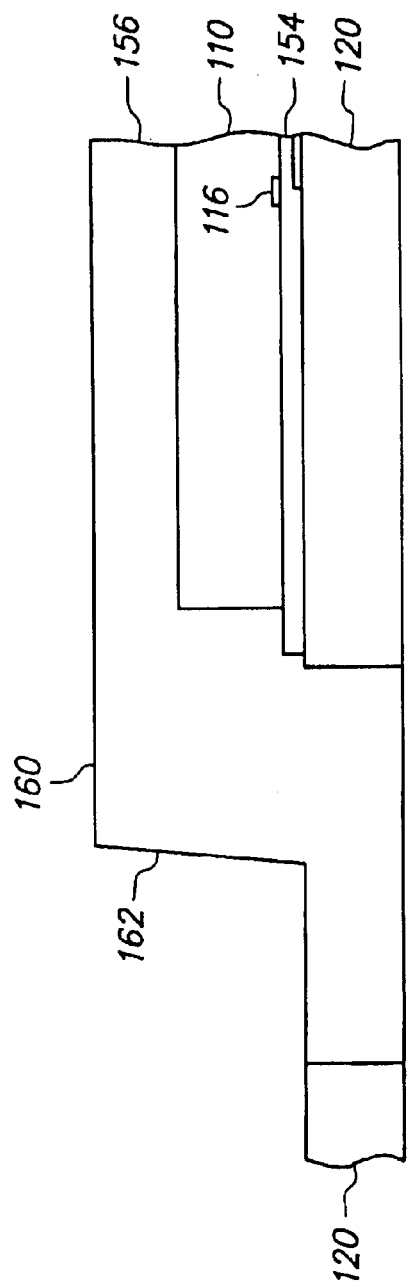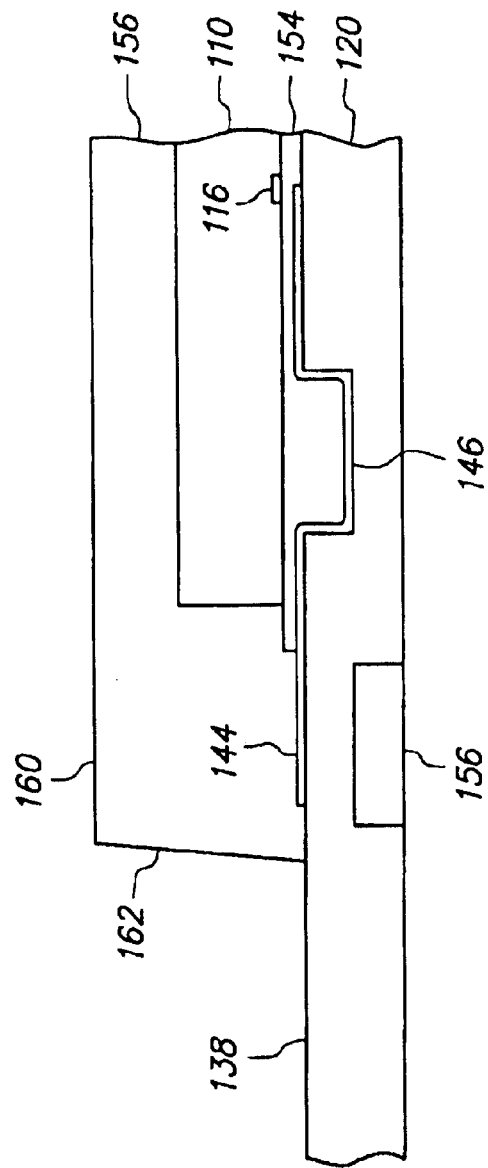

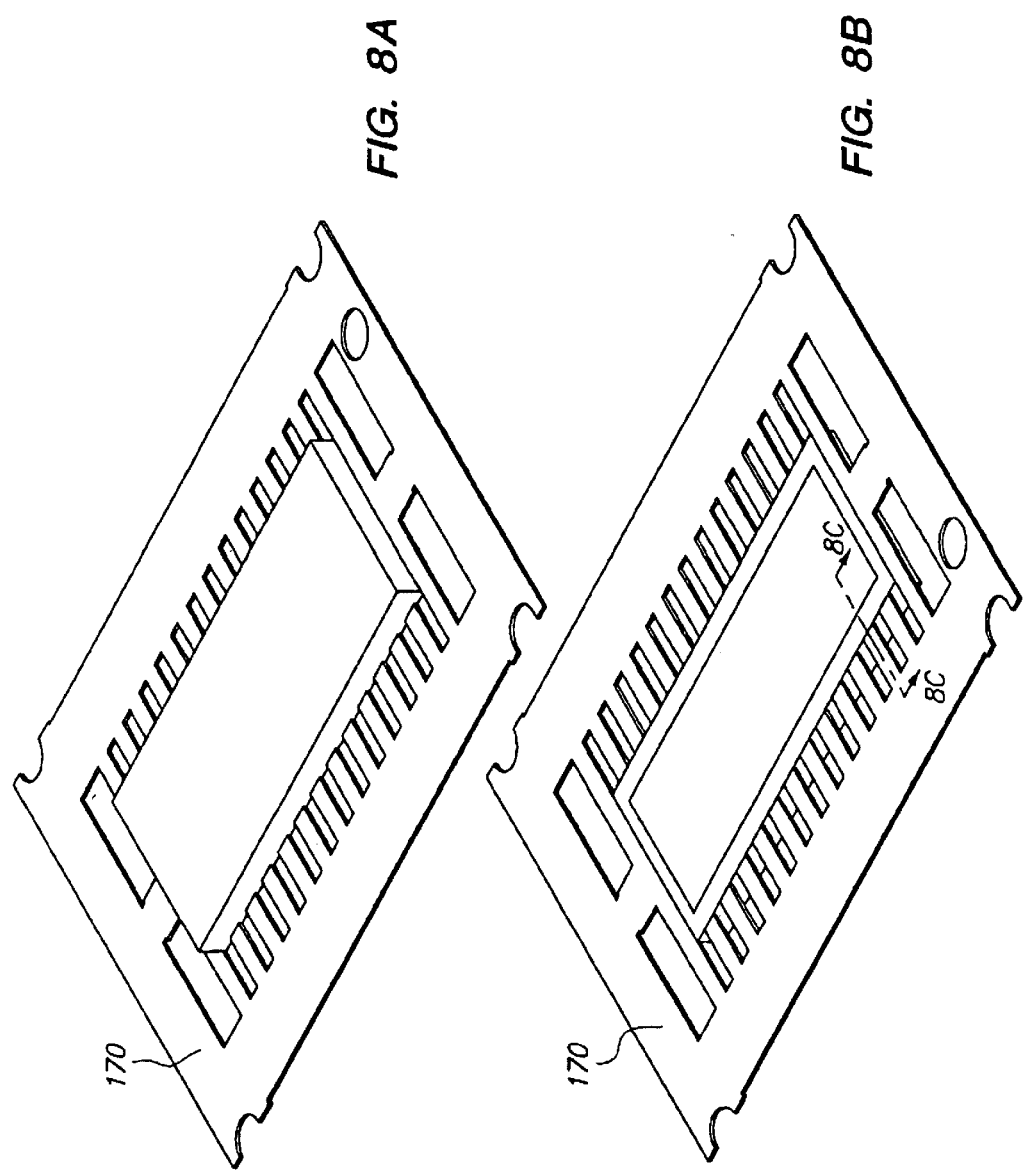

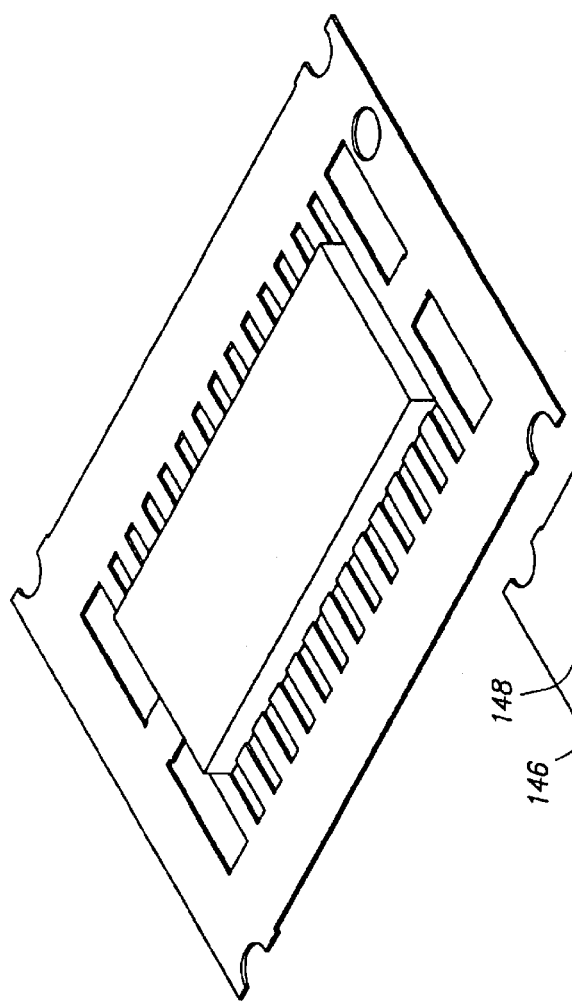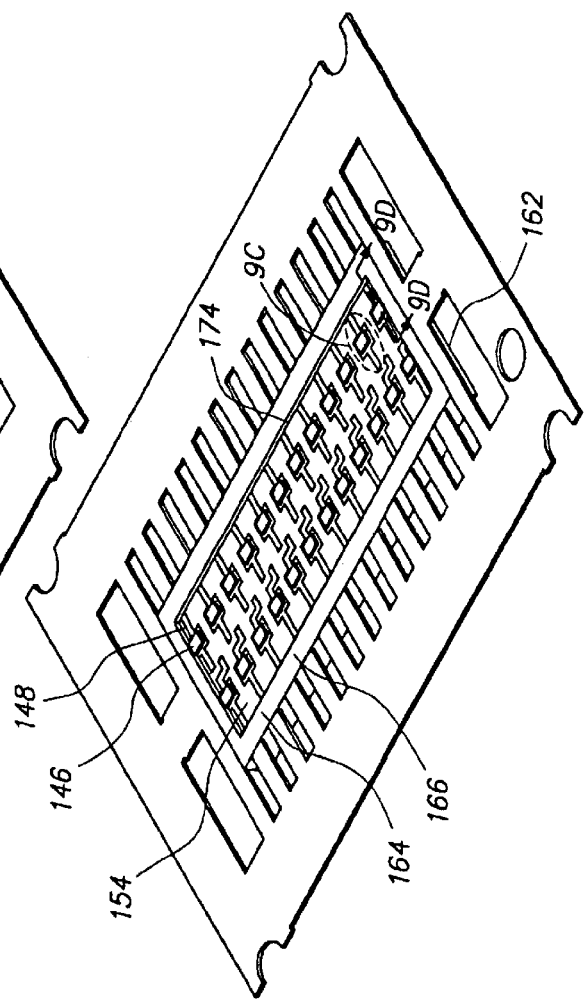

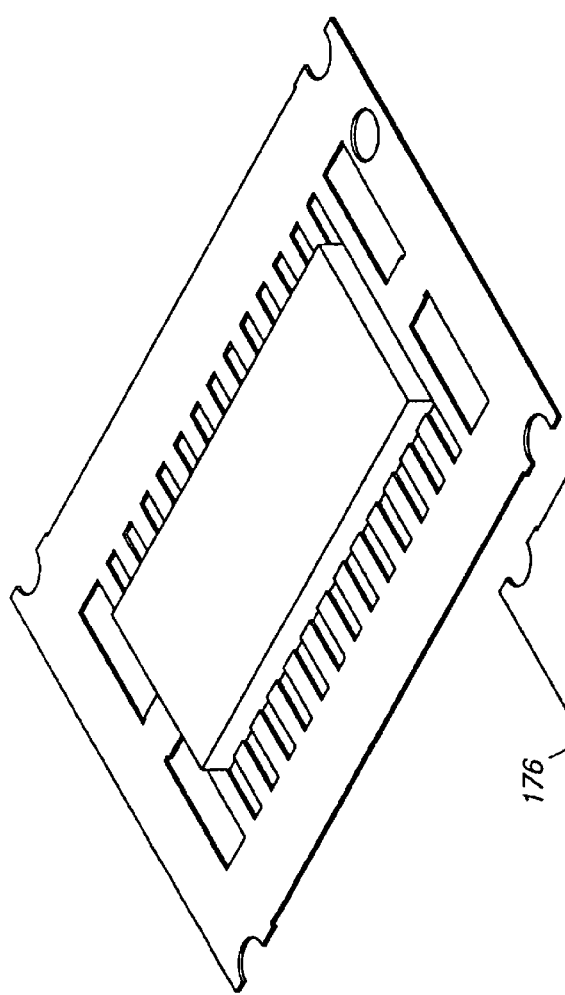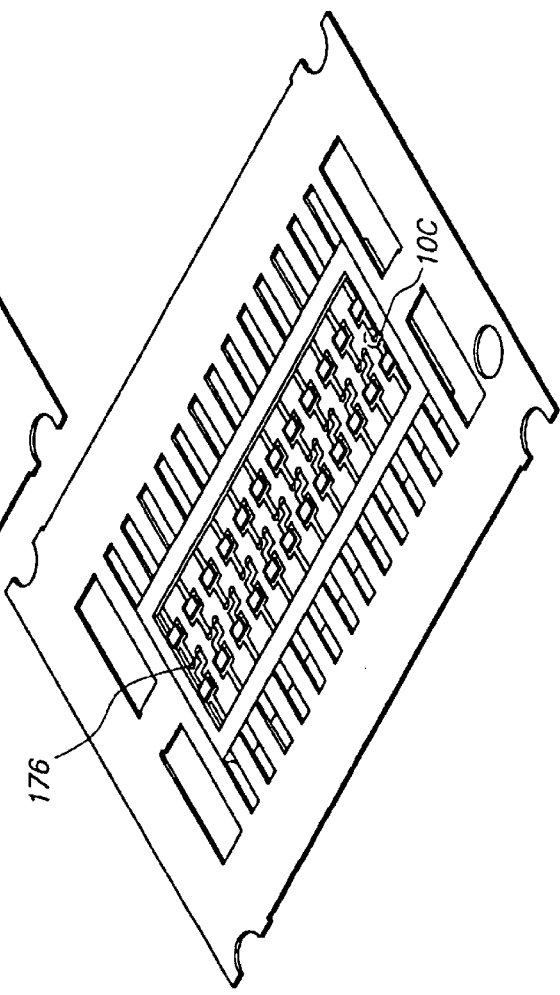

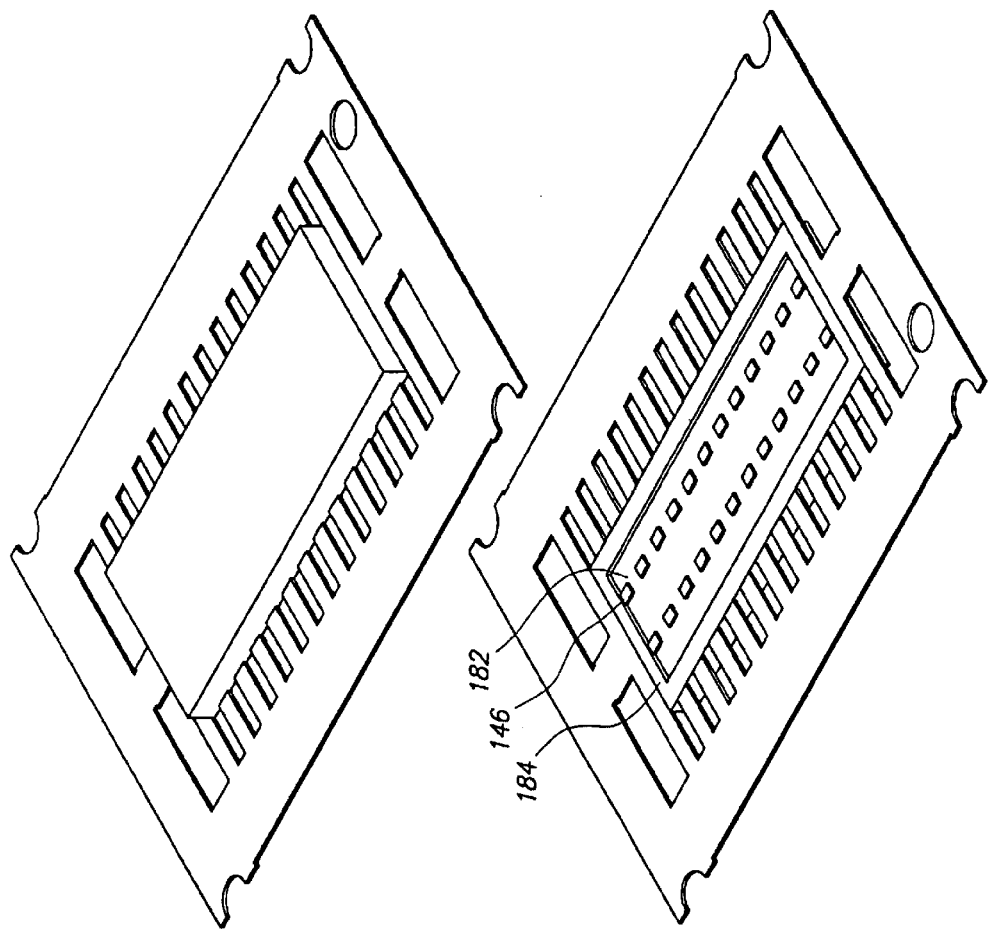

SEMICONDUCTOR PACKAGE DEVICE

BACKGROUND OF THE INVENTION

1. Field of the Invention

The present invention relates to semiconductor packaging, and more particularly to semiconductor package devices and their methods of manufacture and testing.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. An adhesive is normally underfilled between the chip and the support circuit to reduce stress on the solder joints due to thermal mismatch between the chip and the support circuit, and the underfilling process increases both manufacturing complexity and cost. The solder joints exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as thin small outline packages (TSOPs) and ball grid arrays (BGAs) have been developed to address these considerations. TSOPs include an insulative housing that encapsulates the chip and rows of leads that protrude from opposing side surfaces of the insulative housing and are bent to provide distal end portions that are coplanar with or extend below the bottom surface of the insulative housing. The leads are connected to the chip pads in one-to-one relation. BGAs include a substrate with a top surface upon which the chip is mounted, an insulative housing that encapsulates the chip, and an array of balls that protrude from the bottom surface of the substrate. The balls are connected to the chip pads in one-to-one relation.

TSOPs and BGAs provide certain advantages but they have disadvantages as well. For instance, TSOPs are fairly compact but the leads can require significantly larger area than the chip. Thus, TSOPs tend to occupy more surface area than BGAs. BGAs, on the other hand, can be more difficult to test than TSOPs since the balls are less easily inserted into and removed from a test socket than are TSOP leads. Furthermore, standard TSOP test sockets are readily available, whereas the balls are often configured to match the electrical contact arrangement on the printed circuit board in the next level assembly. As a result, a customized test socket may be needed to match the balls. Moreover, TSOP and BGA packages often employ wire bonding, TAB or flip-chip bonding, and as mentioned above, none of these chip pad connection techniques are entirely satisfactory.

In view of the various development stages and limitations in currently available semiconductor package devices, there is a need for a semiconductor package device that is cost-effective, reliable, manufacturable, provides excellent mechanical and electrical performance, and is flexible enough to accommodate test sockets and printed circuit boards with different contact terminal arrangements.

SUMMARY OF THE INVENTION

An object of the present invention is to provide a semiconductor package device that provides a low cost, high performance, high reliability package. Another object of the present invention is to provide a convenient, cost-effective method of making a semiconductor package device. Still another object of the present invention is to provide a method of testing a semiconductor package device.

Generally speaking, the present invention provides a semiconductor package device with terminals that protrude downwardly from the bottom surface of an insulative housing and leads that protrude laterally from the side surfaces of the insulative housing. The terminals and leads are connected together and to the chip pads in one-to-one relation. As a result, the leads can be inserted into a test socket that need not contact the terminals, and the terminals can be mounted on a printed circuit board that need not contact the leads.

In accordance with one aspect of the invention, a semiconductor package device includes an insulative housing, a semiconductor chip, a terminal and a lead, wherein the insulative housing includes a top surface, a bottom surface, and a peripheral side surface between the top and bottom surfaces, the chip includes a conductive pad, the terminal protrudes downwardly from and extends through the bottom surface and is electrically connected to the pad, the lead protrudes laterally from and extends through the side surface and is electrically connected to the pad, the terminal and the lead are spaced and separated from one another outside the insulative housing, and the terminal and the lead are electrically connected to one another inside the insulative housing and outside the chip.

Preferably, the insulative housing includes a first single-piece housing portion that contacts the chip and the lead and is spaced from the terminal, and a second single-piece housing portion that contacts the first single-piece housing portion and the terminal, such that the first housing portion provides the top surface, the side surface and a peripheral portion of the bottom surface, and the second housing portion provides a central portion of the bottom surface within the peripheral portion of the bottom surface.

It is also preferred that the peripheral portion of the bottom surface is shaped as a rectangular peripheral ledge that extends a first distance below the central portion of the bottom surface, the terminal extends a second distance below the central portion of the bottom surface, and the first distance is greater than the second distance.

It is also preferred that the device includes multiple terminals arranged as an array that protrudes downwardly from and extends through the bottom surface of the insulative housing, the device includes multiple leads arranged as TSOP leads that protrude laterally from and extend through opposing side surfaces of the insulative housing, the chip includes multiple conductive pads, and each of the terminals is electrically connected to one of the leads and one of the pads within the insulative housing and outside the chip.

It is also preferred that the device is devoid of wire bonds, TAB leads and solder joints.

In accordance with another aspect of the invention, a method of making a semiconductor package device includes attaching a semiconductor chip to a metallic structure using an insulative adhesive, wherein the chip includes a conductive pad, the metallic structure includes first and second opposing surfaces and a lead, the adhesive is disposed between the first surface and the chip, the lead includes a recessed portion, a non-recessed portion and opposing outer edges between the first and second surfaces that extend across the recessed and non-recessed portions, and the recessed portion is recessed relative to the non-recessed portion at the second surface, forming an encapsulant that contacts the chip, the first surface, the outer edges and the recessed portion, wherein the encapsulant completely covers the chip, the outer edges and the recessed portion without completely covering the non-recessed portion, and forming a connection joint that electrically connects the lead and the pad.

Preferably, the outer edges are defined by slots in the metallic structure, the recessed portion and the slots are formed by selectively etching the metallic structure, the recessed portion is fully formed and the slots are partially formed by selectively etching the metallic structure from the second surface towards the first surface, and the slots are partially formed by selectively etching the metallic structure from the first surface towards the second surface.

It is also preferred that the encapsulant contacts an entire side of the chip opposite the pad, fills the recessed portion and is coplanar with the non-recessed portion at the second surface.

It is also preferred that the encapsulant forms a first insulative housing portion, and a second insulative housing portion is subsequently formed that contacts the adhesive, the terminal and the first insulative housing portion, such that the first and second insulative housing portions form an insulative housing the surrounds the chip.

It is also preferred that the first insulative housing portion is formed by transfer molding and the second insulative housing portion is formed without transfer molding.

In accordance with another aspect of the invention, a method of testing a semiconductor package device includes providing a device that includes an insulative housing, a semiconductor chip, a terminal and a lead, wherein the chip includes a conductive pad, the terminal protrudes downwardly from and extends through a bottom surface of the housing, the lead protrudes laterally from and extends through a side surface of the housing, and the terminal and the lead are electrically connected to one another and the pad inside the insulative housing, attaching the device to a test socket that electrically contacts the lead without electrically contacting the terminal, testing the device using the test socket, and removing the device from the test socket.

Preferably, the method includes trimming the lead after removing the device from the test socket and then attaching the device to a printed circuit board that electrically contacts the terminal without electrically contacting the lead.

It is also preferred that the method includes bending the lead at two corners to provide a TSOP lead with a distal end outside the top and bottom surfaces and then trimming the lead so that the lead no longer extends outside the top and bottom surfaces.

It is also preferred that the method includes trimming the insulative housing and the lead using a laser to shrink the insulative housing and remove the lead.

It is also preferred that the method includes trimming the insulative housing and the lead to convert the device into a chip scale package.

An advantage of the semiconductor package device of the present invention is that it is reliable, cost-effective, easily manufacturable, and can be directly mounted on a printed circuit board. Another advantage is that the device need not include wire bonds, TAB leads or solder joints. Another advantage is that the encapsulant provides a single-piece housing portion that can surround and interlock the leads. Another advantage is that each chip pad is electrically connected to a terminal and a lead, thereby allowing the leads to match a test socket for testing the device and allowing the terminals to match a printed circuit board for the next level assembly. As a result, the device is flexible enough to accommodate test sockets and printed circuit boards with different electrical contact arrangements. Another advantage is that the device can be trimmed after testing the device using the leads and before connecting the device to a printed circuit board using the terminals, thereby converting the device from a TSOP package to a grid array package that provides a chip scale package. Another advantage is that the device can be manufactured using low temperature processes which reduces stress and improves reliability. A further advantage is that the device can be manufactured using well-controlled processes which can be easily implemented by circuit board, lead frame and tape manufacturers. Still another advantage is that the device can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–15A are top perspective views that show a method of making a semiconductor package device in accordance with an embodiment of the present invention;

FIGS. 1B–15B are bottom perspective views corresponding to FIGS. 1A–15A, respectively;

FIG. 4C is an enlarged cross-sectional view taken across line 4C—4C in FIG. 4A that shows the liquid resin filling a representative terminal in greater detail;

FIG. 5C is an enlarged plan view of encircled detail 5C in FIG. 5A that shows a representative pad and routing line in greater detail;

FIG. 6C is an enlarged cross-sectional view taken across line 6C—6C in FIG. 6A that shows the encapsulant filling a representative slot in greater detail;

FIG. 6D is an enlarged cross-sectional view taken across line 6D—6D in FIG. 6A that shows the encapsulant filling a representative recessed portion in greater detail;

DETAILED DESCRIPTION OF THE PREFERRED EMBODIMENTS

FIGS. 1A–15A and 1B–15B are top and bottom perspective views, respectively, of a method of making a semiconductor package device in accordance with an embodiment of the present invention.

Figure 1A:
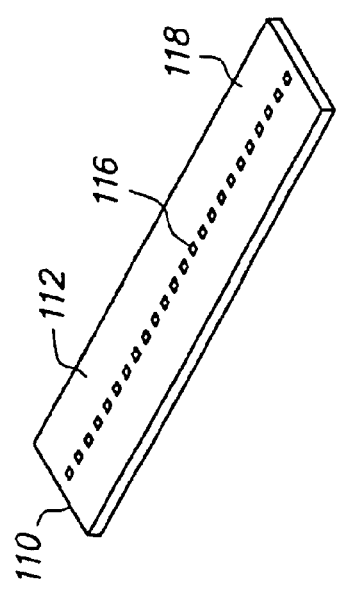
Figure 1B:
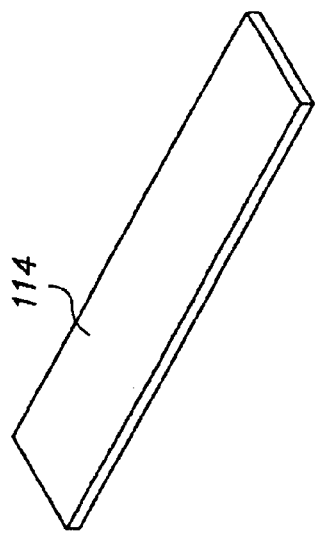

FIGS. 1A and 1B are top and bottom perspective views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 is an upper surface, and surface 114 is a lower surface. Surface 112 is the active surface and includes conductive pads 116 arranged in a single row and passivation layer 118. Pads 116 are substantially aligned with passivation layer 118 so that surface 112 is essentially flat. Alternatively, if desired, pads 116 can extend above or be recessed below passivation layer 118. Pads 116 provide bonding sites to electrically couple chip 110 with external circuitry. Thus, a particular pad 116 can be input/output pad or a power/ground pad. Pads 116 have a length and width of 70 microns.

Pads 116 have aluminum bases that are cleaned by dipping chip 110 in a solution containing 0.05 M phosphoric acid at room temperature for 1 minute and then rinsed in distilled water. Thereafter, pads 116 are treated to provide surface layers that will accommodate subsequently formed connection joints. Pads 116 can be treated by depositing several metal layers, such as chromium/copper/gold or titanium/nickel/gold on the aluminum bases. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pads 116 can be treated by forming nickel surface layers on the aluminum bases. For instance, chip 110 is dipped in a zinc solution to deposit a zinc layer on the aluminum bases. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum bases dissolve. Thereafter, nickel surface layers are electrolessly deposited on the zincated aluminum bases. A suitable electroless nickel plating solution is Enthone Enplate NI-424 at 85° C.

FIGS. 2A and 2B are top and bottom perspective views, respectively, of metal base 120. Metal base 120 is a copper lead frame that includes opposing major surfaces 122 and 124, central portion 126, slots 128, recessed portions 130, 132 and 134, non-recessed portions 136 and leads 138. Slots 128 are formed in two parallel rows and extend between surfaces 122 and 124.

Recessed portions 130 are formed in surface 122, extend into metal base 120 towards surface 124, and are spaced from slots 128. Recessed portions 132 are formed in surface 124, extend into metal base 120 towards surface 122, and are between and adjacent to slots 128 in the same row. Recessed portions 134 are formed in surface 124, extend into metal base 120 towards surface 122, and are between and adjacent to slots 128 in separate rows. Non-recessed portions 136 are between and adjacent to slots 128 in the same row, and are adjacent to recessed portions 132. Leads 138 include recessed portions 132 and non-recessed portions 136.

Thus, recessed portions 130 are recessed relative to non-recessed portions 136 at surface 122 and coplanar with non-recessed portions 136 at surface 124, and recessed portions 132 and 134 are coplanar with non-recessed portions 136 at surface 122 and recessed relative to non-recessed portions 136 at surface 124. Recessed portions 130 and leads 138 are arranged in two parallel rows and each recessed portion 130 is aligned with a corresponding lead 138. Leads 138 include opposing parallel outer edges defined by adjacent slots 128, and the outer edges extend across recessed portions 132 and non-recessed portions 136. The combination of slots 128, recessed portions 132 and recessed portions 134 provide a continuous rectangular channel that is adjacent to and extends 360 degrees around central portion 126, and slots 128 provide comb-like canals that extend outwardly from the channel. Metal base 120 includes other openings and notches that are used for tooling engagement and alignment purposes.

Metal base 120 has a thickness of 200 microns, slots 128 have a length of 1500 microns, a width of 300 microns and a center-to-center spacing of 800 microns, recessed portions 130 have a length and width of 500 microns and a depth of 120 microns, recessed portions 132 have a length and width of 500 microns and a depth of 120 microns, recessed portions 134 have a width of 500 microns and a depth of 120 microns, and leads 138 have a length of 1500 microns (500 microns at recessed portions 132 and 1000 microns at non-recessed portions 136), a width of 500 microns and a center-to-center spacing of 800 microns.

Figure 2C:
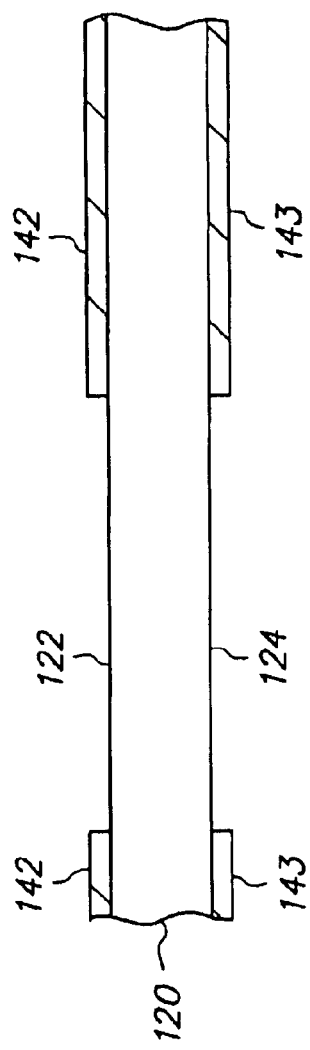
FIGS. 2C, 2D and 2E are enlarged cross-sectional views taken across line 2C—2C in FIGS. 2A and 2B that show the formation of a representative slot in greater detail.
Figure 2D:
Figure 2E:
Figure 2F:
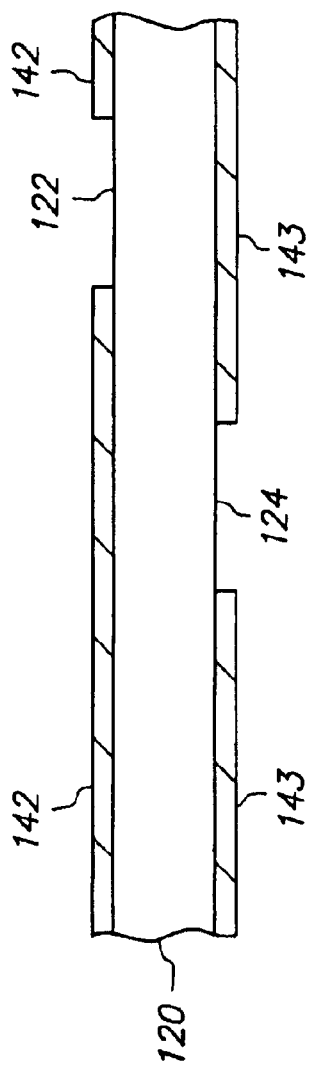
FIGS. 2F, 2G and 2H are enlarged cross-sectional views taken across line 2F—2F in FIGS. 2A and 2B that show the formation of representative recessed portions in greater detail.
Figure 2G:
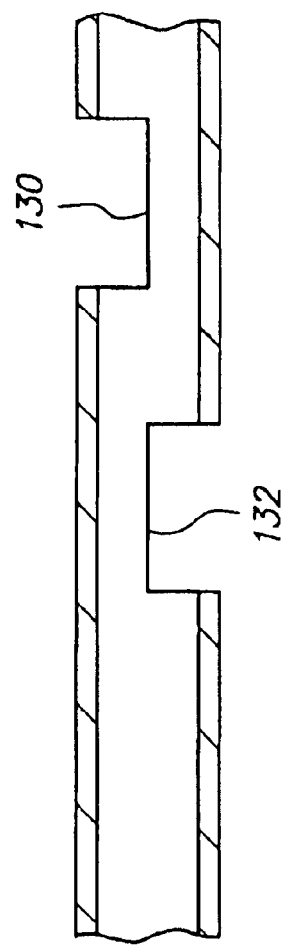
Figure 2H:

FIGS. 2C, 2D and 2E are enlarged cross-sectional views taken across line 2C—2C in FIGS. 2A and 2B that show the formation of a representative slot 128 in greater detail, and FIGS. 2F, 2G and 2H are enlarged cross-sectional views taken across line 2F—2F in FIGS. 2A and 2B that show the formation of representative recessed portions 130 and 132 in greater detail.

FIGS. 2C and 2F are enlarged cross-sectional views of photoresist layers 142 and 143 formed on surfaces 122 and 124, respectively. Photoresist layers 142 and 143 are simultaneously deposited as continuous dry films and then patterned by selectively applying light through respective reticles (not shown), applying a developer solution to remove the photoresist portions rendered soluble by the light, and then hard baking, as is conventional. As a result, photoresist layer 142 contains openings that selectively expose portions of surface 122, and photoresist layer 142 contains openings that selectively expose portions of surface 124. Photoresist layers 142 and 143 have a thickness of 15 microns.

FIGS. 2D and 2G are enlarged cross-sectional views of various features formed in metal base 120 by wet chemical etching using photoresist layers 142 and 143 as etch masks. In particular, the structure is dipped in a wet chemical etch that provides a front-side etch through the openings in photoresist layer 142 to the exposed portions of surface 122 and a back-side etch through the openings in photoresist layer 143 to the exposed portions of surface 124. The structure is submerged in the wet chemical etch long enough for the etchant to etch about 120 microns into metal base 120. That is, the wet chemical etch provides a "half-etch" that removes slightly over one-half ($^{120}/_{200}$) the thickness of metal base 120 at the exposed portions. Thus, the front-side etch partially forms slot 128 and completely forms recessed portion 130, the back-side etch partially forms slot 128 and completely forms recessed portion 132, and the combination of the front-side and back-side etches completely forms slot 128. Likewise, the front-side and back-side etches are applied simultaneously, and slot 128, recessed portion 130 and recessed portion 132 are formed simultaneously. The wet chemical etch also forms the other slots 128, recessed portions 130 and recessed portions 132 as well as recessed portions 134 and the unlabeled openings and notches in a similar manner.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing metal base 120 to the wet chemical etch to provide the desired etch depth can be established through trial and error.

FIGS. 2E and 2H are enlarged cross-sectional views of metal base 120 after-photoresist layers 142 and 143 are simultaneously stripped.

FIGS. 3A and 3B are top and bottom perspective views, respectively, of metal traces 144 formed on metal base 120. Metal traces 144 include terminals 146 and routing lines 148. Terminals 146 are formed in recessed portions 130, extend into metal base 120 and protrude below routing lines 148. Terminals 146 are bumped and include cavities that extend into and face away from recessed portions 130. Routing lines 148 are formed outside recessed portions 130 and extend from terminals 146 to leads 138. More particularly, routing lines 148 extend to recessed portions 132 where they are centered between the adjoining slots 128 but do not extend to non-recessed portions 136. Routing lines 148 also extend from terminals 146 towards the inside of central portion 126 in the opposite direction. Thus, each metal trace 144 includes a terminal 146 in a corresponding recessed portion 130 and a routing line 148 that (1) extends from the terminal 146 to a corresponding lead 138, and (2) extends from the terminal 146 in the opposite direction towards the inside of central portion 126. Accordingly, leads 138 and metal traces 144 are formed in one-to-one relation. Conductive traces 150 include leads 138 and metal traces 144.

Metal traces 144 are electroplated onto metal base 120. Metal traces 144 are composed of a first nickel layer electroplated onto metal base 120, a copper layer electroplated onto the first nickel layer, and a second nickel layer electroplated onto the copper layer. Thus, the first nickel layer is sandwiched between and contacts metal base 120 and the copper layer, the copper layer is sandwiched between and contacts the first and second nickel layers, and the second nickel layer contacts the copper layer and is exposed. The first and second nickel layers and the copper layer are shown as a single layer for convenience of illustration.

Metal traces 144 have a thickness of 10 microns provided by the first nickel layer with a thickness of 1 micron, the copper layer with a thickness of 8 microns, and the second nickel layer with a thickness of 1 micron. Terminals 146 have a length and width of 500 microns and a height of 120 microns, and routing lines 148 have a width (orthogonal to the elongated length) of 55 microns.

Terminals 146 include tapered sidewalls that slant inwardly as the vertical distance from routing lines 148 increases. This follows the shape of recessed portions 130, which have tapered sidewalls due to the isotropic nature of the wet chemical etch. For convenience of illustration, the sidewalls are shown generally orthogonal to surface 122.

Figure 3C:
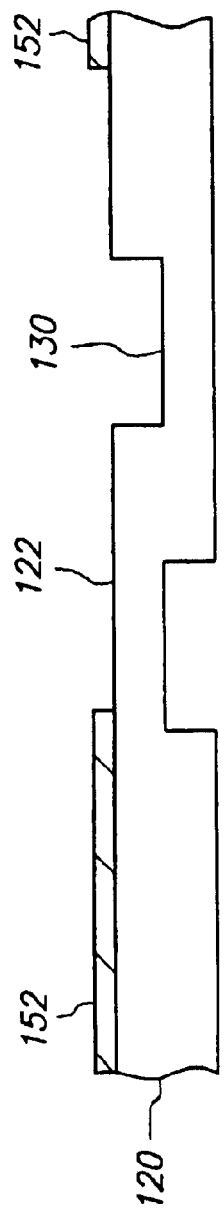
FIGS. 3C, 3D and 3E are enlarged cross-sectional views taken across line 3C—3C in FIG. 3A that show the formation of a representative metal trace in greater detail.
Figure 3D:
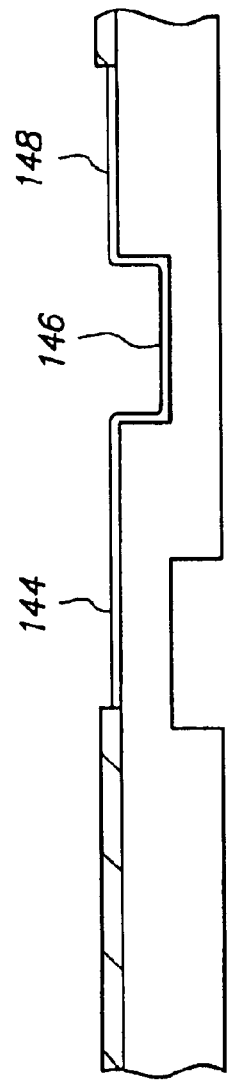
Figure 3E:

FIGS. 3C, 3D and 3E are enlarged cross-sectional views taken across line 3C—3C in FIG. 3A that show the formation of a representative metal trace 144 in greater detail. FIG. 3C is an enlarged cross-sectional view of photoresist layer 152 formed on surface 122. Photoresist layer 152 is deposited as a continuous dry film and then patterned by selectively applying light through a reticle (not shown), applying a developer solution to remove the photoresist portions rendered soluble by the light, and then hard baking, as is conventional. As a result, photoresist layer 152 contains an opening that selectively exposes a portion of surface 122 that includes recessed portion 130. Photoresist layer 152 has a thickness of 15 microns.

FIG. 3D is an enlarged cross-sectional view of metal trace 144 formed on metal base 120. Metal trace 144 is formed in the opening in photoresist layer 152 and on the exposed portion of surface 122 by an electroplating operation using photoresist layer 152 as a plating mask. Thus, metal trace 144 is formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The nickel electroplating operation continues until the second nickel layer has the desired thickness. Thereafter, the structure is removed from the electrolytic nickel plating solution and rinsed in distilled water to remove contaminants.

FIG. 3E is an enlarged cross-sectional view of metal base 120 and metal trace 144 after photoresist layer 152 is stripped.

FIGS. 4A and 4B are top and bottom perspective views, respectively, of adhesive 154 formed on metal base 120 and metal traces 144. Adhesive 154 may include an organic surface protectant such as HK 2000 which is promptly applied to metal base 120 and metal traces 144 after photoresist layer 152 is stripped to reduce native oxide formation on the exposed surfaces. The use of organic surface protectant layers in insulative adhesives for semiconductor package devices is well-known in the art. Thereafter, a liquid resin (A stage) epoxy is applied over a predetermined portion of central portion 126 using stencil printing. During stencil printing, a stencil (not shown) is placed over metal base 120, a stencil opening is aligned with the predetermined portion, and then a squeegee (not shown) pushes the liquid resin along the surface of the stencil opposite metal base 120, through the stencil opening and onto the predetermined portion. The liquid resin is compliant enough at room temperature to conform to virtually any shape. The predetermined portion of central portion 126 is slightly offset from the periphery of central portion 126. Therefore, the liquid resin fills terminals 146 but does not reach surface 124 or slots 128. The liquid resin has a thickness of 30 microns over surface 122.

FIG. 4C is an enlarged cross-sectional view taken across line 4C—4C in FIG. 4A that shows the liquid resin filling a representative terminal 146 in greater detail.

Figure 5A:
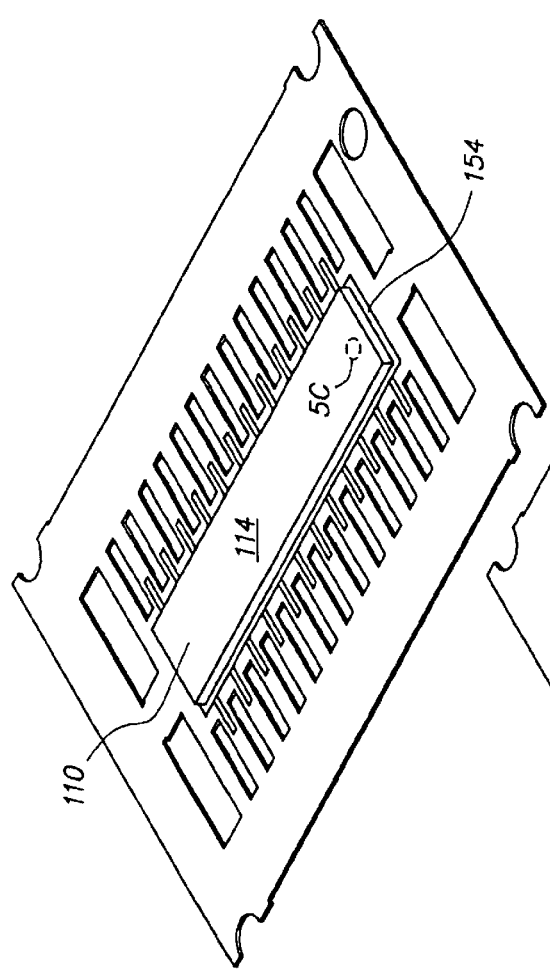
Figure 5B:
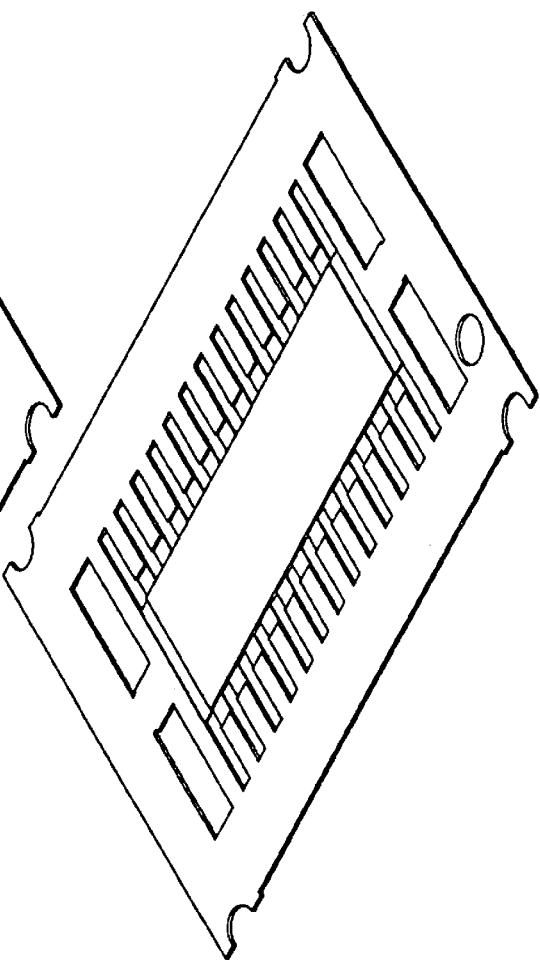

FIGS. 5A and 5B are top and bottom perspective views, respectively, of chip 110 mechanically attached to metal base 120 by adhesive 154. Adhesive 154 is disposed between and contacts surface 112 of chip 110 and metal base 120, and is disposed between and contacts surface 112 of chip 110 and metal traces 144. Thus, surface 112 of chip 110 faces towards metal base 120 and metal traces 144 and is covered, and surface 114 of chip 110 faces away from metal base 120 and metal traces 144 and is exposed. Chip 110 and metal base 120 do not contact one another, and chip 110 and metal traces 144 do not contact one another.

Chip 110 and metal base 120 are positioned relative to one another so that chip 110 is disposed within the periphery of adhesive 154, terminals 146 are disposed within the periphery of chip 110 between pads 116 and the outer edges of chip 110, routing lines 148 extend within and outside the periphery of chip 110 and overlap and are electrically isolated from pads 116, and slots 128, recessed portions 132 and 134, non-recessed portions 136 and leads 138 are disposed outside the periphery of chip 110. Routing lines 148 overlap pads 116 in one-to-one relation. Thus, each pad 116 has an associated conductive trace 150 which includes a single lead 138, terminal 146 and routing line 148.

Chip 110 and metal base 120 can be aligned using an automated pattern recognition system. Adhesive 154 is sandwiched between chip 110 and metal base 120 using relatively low pressure. Thereafter, adhesive 154 is heated and fully cured (C stage) at relatively low temperature in the range of 200 to 250° C. to form a solid adhesive electrically insulative thermosetting epoxy die attach that mechanically fastens chip 110 to metal base 120 and metal traces 144. Adhesive 154 is 10 microns thick between pads 116 and routing lines 148.

At this stage, metal base 120 provides a carrier for chip 110.

FIG. 5C is an enlarged plan view of encircled detail 5C in FIG. 5A that shows a representative pad 116 and routing line 148 in greater detail. Since pad 116 and routing line 148 are not visible from surface 114 of chip 110, they are shown in phantom. Routing line 148 includes a distal end that overlaps pad 116.

FIGS. 6A and 6B are top and bottom perspective views, respectively, of encapsulant 156 formed on chip 110 and metal base 120 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot though a tree-like array of runners and gates into closed cavities. Molding compounds are well-known in the art.

Initially the structure is accurately positioned within a mold (not shown). The mold contacts surfaces 122 and 124 slightly outside recessed portions 132 and 134, but does not contact or extend into recessed portions 132 and 134. The mold defines a box-shaped mold cavity that extends above surface 122, surrounds chip 110 and adhesive 154, overlaps recessed portions 132 and 134, and slightly overlaps non-recessed portions 136. Thus, portions of slots 128 adjacent to recessed portions 132 extend into the mold cavity, while other portions of slots 128 adjacent to non-recessed portions 136 do not. Next, encapsulant 156 is introduced into the mold cavity as a liquid resin under pressure and then hardened to form a solid single-piece molded plastic base during the transfer molding operation. Encapsulant 156 fills the mold cavity and contacts all exposed surfaces within the mold cavity. As a result, encapsulant 156 forms a box-shaped portion, shaped like the mold cavity, that contacts and extends above surface 114 and the outer edges of chip 110, surface 122, routing lines 148 and adhesive 154. Furthermore, encapsulant 156 fills slots 128 and recessed portions 132 and 134. That is, since slots 128 and recessed portions 132 and 134 form a continuous rectangular channel with outwardly extending comb-like canals, and encapsulant 156 enters slots 128 and recessed portions 132 and 134 under pressure, encapsulant 156 fills and assumes the shape of the channel and canals. However, surface 124 outside recessed portions 132 and 134 remains exposed, and encapsulant 156 does not contact (or contacts substantially none of) surface 124 outside recessed portions 132 and 134. Likewise, encapsulant 156 does not contact pads 116 or terminals 146.

Encapsulant 156 forms a first single-piece housing portion that includes top surface 160, four peripheral side surfaces 162 and bottom surface 164. Encapsulant 156 also includes peripheral portion 166 at bottom surface 164. Peripheral portion 166 has a rectangular shape (in the channel) with outwardly extending comb-like fingers (in the canals). Top surface 160 occupies the entire surface area between side surfaces 162, however bottom surface 164 does not. Peripheral portion 166 occupies a peripheral portion of the surface area between side surfaces 162 that is outside the periphery of chip 110 without occupying an inner central portion of the surface area between side surfaces 162. Central portion 126 is surrounded by, adjacent to and coplanar with peripheral portion 166, occupies the inner central portion and remains exposed. Thus, bottom surface 164 of encapsulant 156 at peripheral portion 166 is coplanar with surface 124 of metal base 120 at central portion 126. In addition, encapsulant 156 completely surrounds leads 138. In particular, encapsulant 156 contacts the tops of recessed portions 132 at surface 122, the outer edges of recessed portions 132 at slots 128, and the bottoms of recessed portions 132 at surface 124, thereby forming lateral openings with sidewalls that contact and span 360 degrees around leads 138. As a result, encapsulant 156 interlocks leads 138, thereby enhancing the mechanical attachment between chip 110 and leads 138.

Encapsulant 156 is a solid adherent compressible protective layer that provides back-side environmental protection such as moisture resistance and particle protection for chip 110 as well as mechanical support for leads 138.

FIG. 6C is an enlarged cross-sectional view taken across line 6C—6C in FIG. 6A that shows encapsulant 156 filling a representative slot 128 in greater detail, and FIG. 6D is an enlarged cross-sectional view taken across line 6—6D in FIG. 6A that shows encapsulant 156 filling a representative recessed portion 132 in greater detail.

Figure 7A:
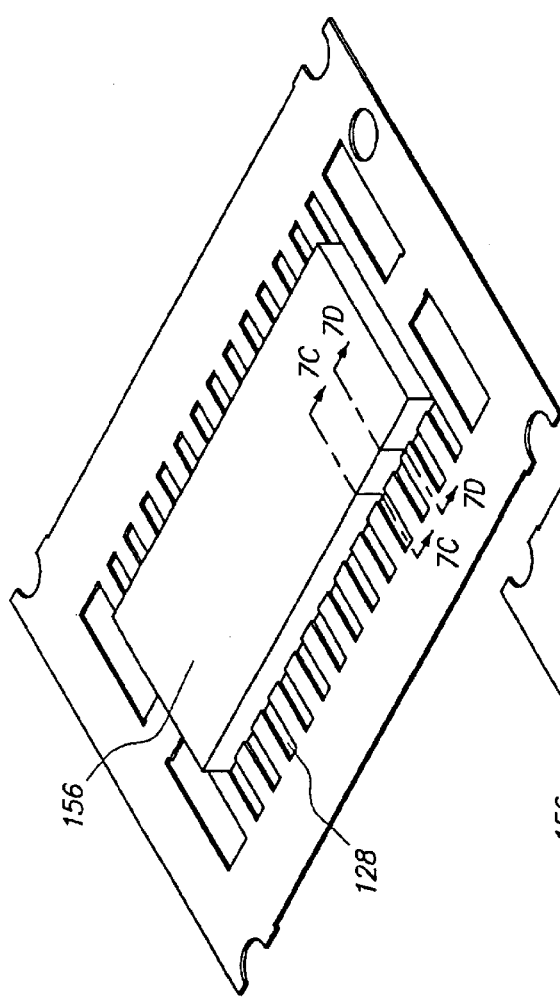
Figure 7B:
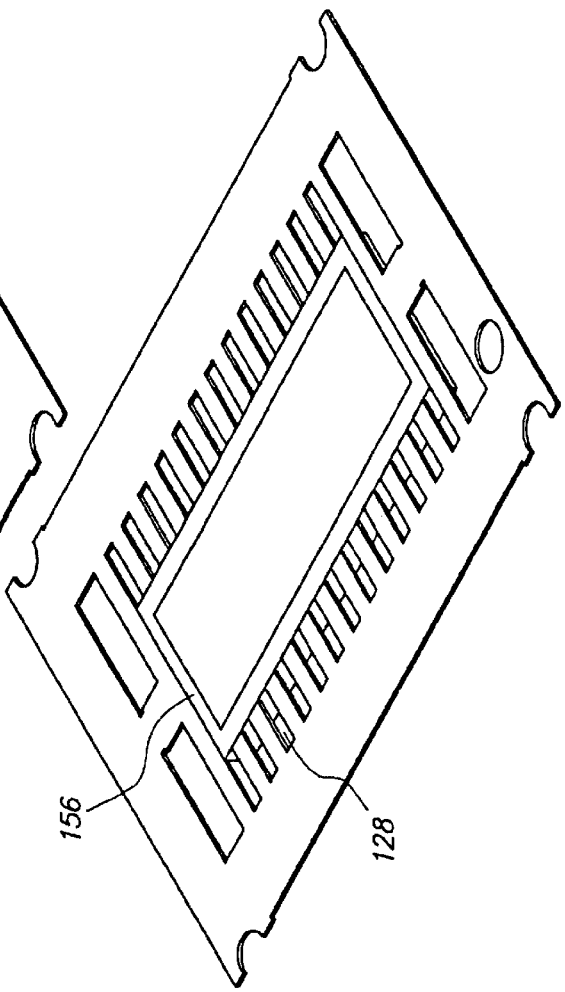

FIGS. 7A and 7B are top and bottom perspective views, respectively, of encapsulant 156 removed from portions of slots 128 that laterally extend outwardly at side surfaces 162. In other words, the comb-like fingers of encapsulant 156 are selectively removed while the remainder of encapsulant 156 remains intact. This can be accomplished using a mechanical trimming operation. For instance, a mold die (not shown) with an excise blade and a base can be used.

The excise blade contains two rows of comb-like blade portions that are aligned with and disposed above slots 128, and the base contains two rows of openings that are aligned with and disposed below slots 128 as the structure is spaced from the excise blade and rests on the base.

The excise blade is then actuated toward the base such that each blade portion enters a corresponding slot 128 and cuts off the finger of encapsulant 156 within that slot.

At this stage, leads 138 are arranged in opposing rows that protrude laterally from and extend through two opposing side surfaces 162 of encapsulant 156.

Figure 7C:
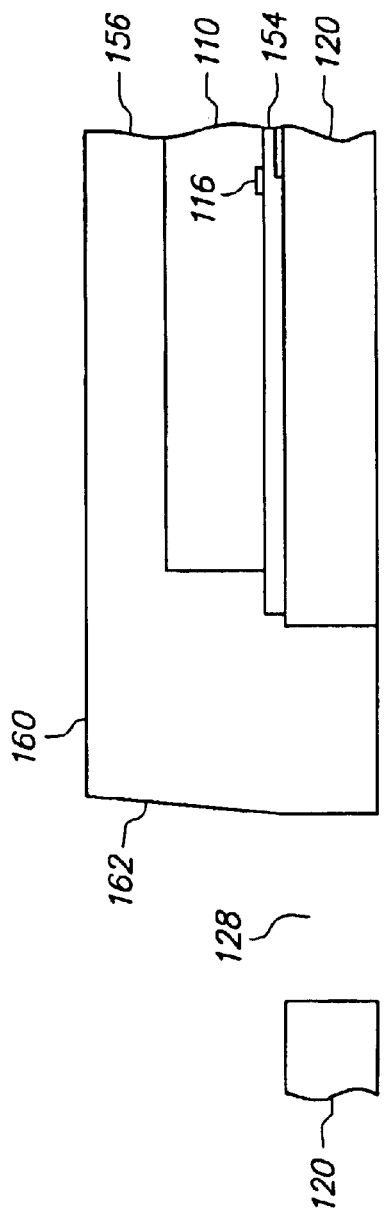
FIG. 7C is an enlarged cross-sectional view taken across line 7C—7C in FIG. 7A that shows the encapsulant removed from a portion of a representative slot in greater detail.
Figure 7D:
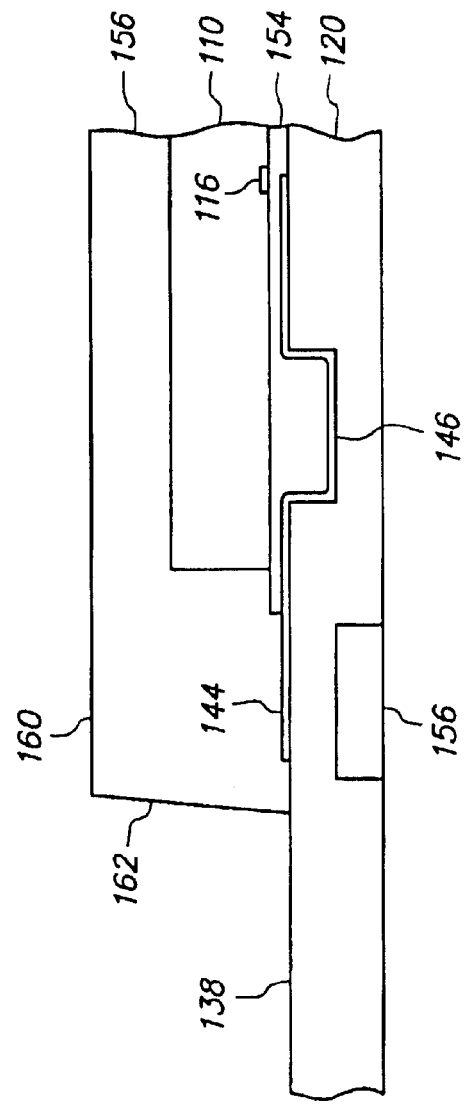
FIG. 7D is an enlarged cross-sectional view taken across line 7D—7D in FIG. 7A that shows the encapsulant intact in a representative recessed portion in greater detail.

FIG. 7C is an enlarged cross-sectional view taken across line 7C—7C in FIG. 7A that shows encapsulant 156 removed from a portion of a representative slot 128 in greater detail, and FIG. 7D is an enlarged cross-sectional view taken across line 7D—7D in FIG. 7A that shows encapsulant 156 intact in a representative recessed portion 132 in greater detail.

FIGS. 8A and 8B are top and bottom perspective views, respectively, of protective coating 170 formed on metal base 120 outside the periphery of encapsulant 156. Thus, protective coating 170 covers the exposed surfaces of metal base 120 outside central portion 126. More particularly, protective coating 170 covers the portions of leads 138 that protrude from encapsulant 156 as well as the remaining portions of metal base 120 outside leads 138. Protective coating 170 is electroplated onto metal base 120 and is composed of tin with a thickness of 20 microns. For convenience of illustration, protective coating 170 is considered a surface layer that is part of metal base 120 and leads 138.

Figure 8C:
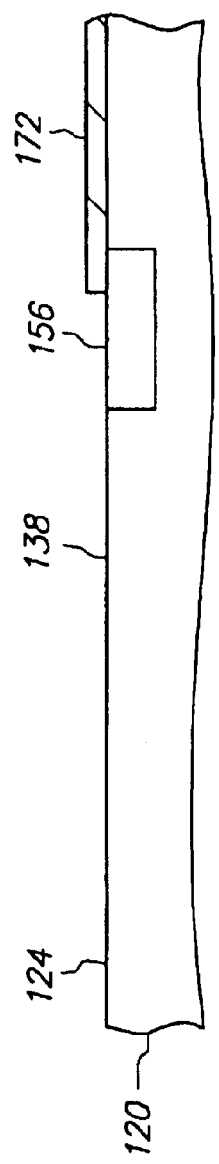
FIGS. 8C, 8D and 8E are enlarged cross-sectional views taken across line 8C—8C in FIG. 8B that show the formation of a protective coating in greater detail.
Figure 8D:
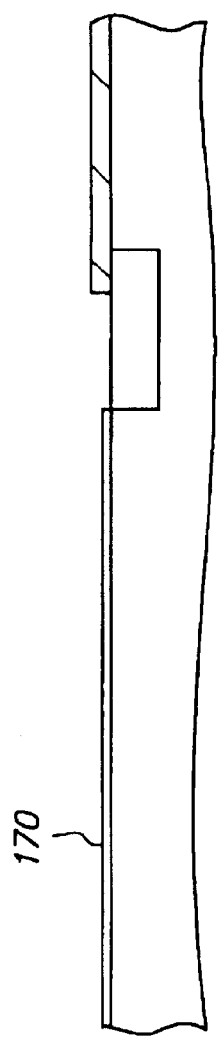
Figure 8E:

FIGS. 8C, 8D and 8E are enlarged cross-sectional views taken across line 8C—8C in FIG. 8B that show the formation of protective coating 170 in greater detail.

FIG. 8C is an enlarged cross-sectional view of ink layer 172 formed on surface 124. Ink layer 172 is deposited as a liquid resin (A stage) epoxy over central portion 126 using stencil printing. Thereafter, the liquid resin is cured or hardened at relatively low temperature of about 120° C. to form a solid layer. As a result, ink layer 172 covers central portion 126 at surface 124, overlaps encapsulant 156 at surface 164 and selectively exposes the remainder of metal base 120 outside encapsulant 156. Ink layer 172 has a thickness of 30 microns.

FIG. 8D is an enlarged cross-sectional view of protective coating 170 formed on metal base 120. Protective coating 170 is formed on the exposed portions of metal base 120 by an electroplating operation using ink layer 172 as a plating mask. Initially, a plating bus (not shown) is connected to metal base 120, current is applied to the plating bus from an external power source, and metal base 120 is submerged in an electrolytic tin plating solution such as Technic Techni NF MTB at room temperature. As a result, the tin electroplates on the exposed surfaces of metal base 120. The tin electroplating operation continues until the tin layer has the desired thickness. Thereafter, the structure is removed from the electrolytic tin plating solution and rinsed in distilled water to remove contaminants.

FIG. 8E is an enlarged cross-sectional view of metal base 120 and protective layer 170 after ink layer 172 is stripped using an alkaline solution that is highly selective of the epoxy ink with respect to tin, copper and the molding compound.

FIGS. 9A and 9B are top and bottom perspective views, respectively, of the structure after central portion 126 of metal base 120 is removed. The structure is dipped in a wet chemical etch that is highly selective of copper with respect to tin, nickel, epoxy and the molding compound. Therefore, the wet chemical etch removes central portion 126 but has no appreciable effect on leads 138, metal traces 144, adhesive 154, encapsulant 156 and protective coating 170. As a result, terminals 146, routing lines 148 and adhesive 154 become exposed. Peripheral portion 166 is shaped as a rectangular peripheral ledge with four inner side surfaces 174 previously adjacent to and covered by central portion 126 that become exposed. Inner side surfaces 174 are located within and face away from outer side surfaces 162, are orthogonal to bottom surface 164, and extend between adhesive 154 and bottom surface 164.

A suitable wet chemical etch can be provided by the same solution used to form slots 128 and recessed portions 130, 132 and 134. The optimal etch time for exposing the structure to the wet chemical etch without excessively exposing the portions of leads 138 embedded in peripheral portion 166 and adjacent to inner side surfaces 174 after the selected copper has been removed can be established through trial and error.

The wet chemical etch initially removes the first 80 microns of central portion 126 and reaches terminals 146. However, the first nickel layers of terminals 146, which were electroplated on metal base 120, become the exposed surface layers for terminals 146 and provide etch masks that protect the underlying copper layers (between the first and second nickel layers). Thereafter, the wet chemical etch removes the remaining 120 microns of central portion 126 and reaches routing lines 148 and adhesive 154. However, the first nickel layers of routing lines 148, which were electroplated on metal base 120, become the exposed surface layers for routing lines 148. Furthermore, routing lines 148 are embedded in and coplanar with adhesive 154 at the exposed surface that was adjacent to central portion 126. Therefore, the exposed nickel surfaces of routing lines 148 and adhesive 154 provide etch masks that protect the underlying copper layers (between the first and second nickel layers) of routing lines 148.

Advantageously, encapsulant 156 interlocks and provides mechanical support for leads 138, and therefore reduces the mechanical strain on adhesive 154. The enhanced mechanical strength is particularly useful after central portion 126 has been removed.

At this stage, chip 110 remains embedded in adhesive 154 and encapsulant 156, and routing lines 148 overlap and remain electrically isolated from pads 116.

Figure 9C:
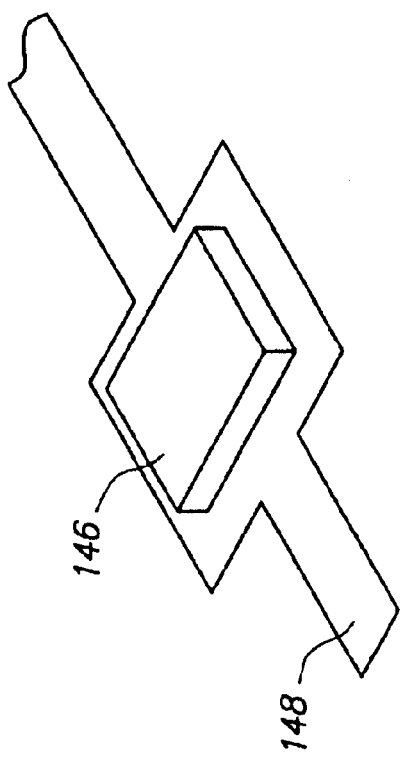
FIG. 9C is an enlarged perspective view of encircled detail 9C in FIG. 9B that shows a representative terminal in greater detail.
Figure 9D:
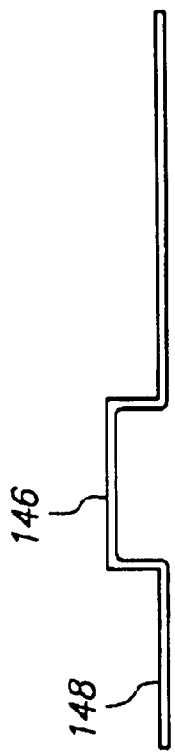
FIG. 9D is an enlarged cross-sectional view taken across line 9D—9D in FIG. 9B that shows a representative terminal in greater detail.

FIG. 9C is an enlarged perspective view of encircled detail 9C in FIG. 9B that shows a representative terminal 146 in greater detail, and FIG. 9D is an enlarged cross-sectional view taken across line 9D—9D in FIG. 9B that shows a representative terminal 146 in greater detail.

FIGS. 10A and 10B are top and bottom perspective views, respectively, of the structure after portions of adhesive 154 are selectively removed to form openings 176 in adhesive 154 that expose pads 116. Openings 176 are formed by applying a suitable etch that is highly selective of adhesive 154 with respect to pads 116 and routing lines 148.

In this instance, a selective laser etch is applied. Using projection laser ablation, a metal mask (not shown) is positioned relative to adhesive 154 such that openings in the metal mask are aligned with pads, and a laser is directed to the side of the metal mask opposite adhesive 154.

Accordingly, the metal mask targets the laser at pads 116. The laser removes portions of adhesive 154 above pads 116 and outside routing lines 148. Openings 176 have a diameter of 100 microns, and pads 116 (with a length and width of 70 microns) are exposed by and axially aligned with openings 176. Routing lines 148 shield the underlying adhesive 154 from the laser etch so that the portions of adhesive 154 sandwiched between routing lines 148 and pads 116 remain intact. Openings 176 are formed in adhesive 154 without damaging pads 116, passivation layer 118 and routing lines 148. Thus, openings 176 extend through adhesive 154, but do not extend into chip 110.

Figure 10C:
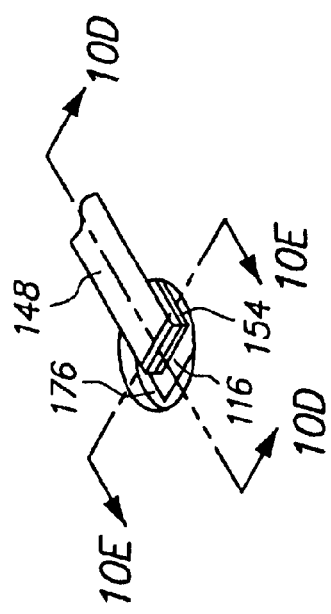
FIG. 10C is an enlarged perspective view of encircled detail 10C in FIG. 10B that shows a representative pad, routing line and opening in greater detail.
Figure 10D:
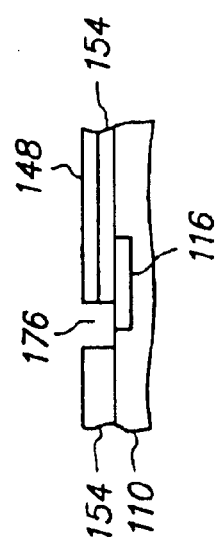
FIGS. 10D and 10E are enlarged cross-sectional views taken across lines 10D—10D and 10E—10E, respectively, in FIG. 10C.
Figure 10E:
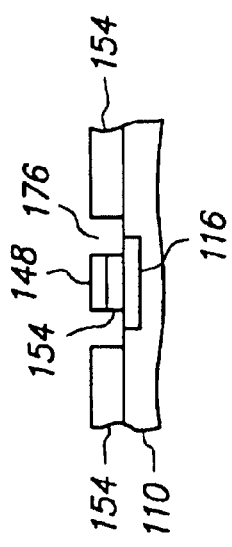

FIG. 10C is an enlarged perspective view of encircled detail 10C in FIG. 10B that shows a representative pad 116, routing line 148 and opening 176 in greater detail, and FIGS. 10D and 10E are enlarged cross-sectional views taken across lines 10D—10D and 10E—10E, respectively, in FIG. 10C.

Figure 11A:
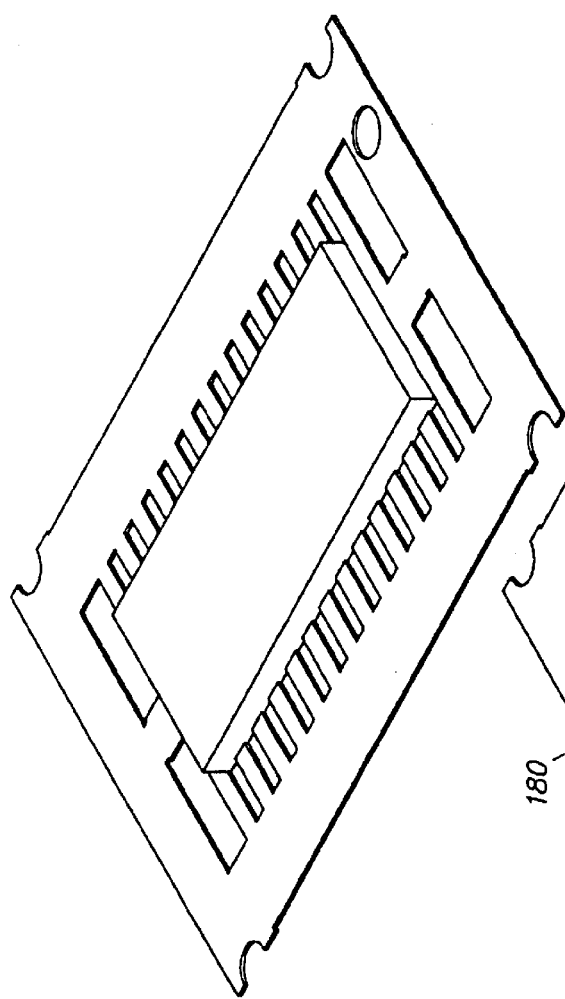
Figure 11B:
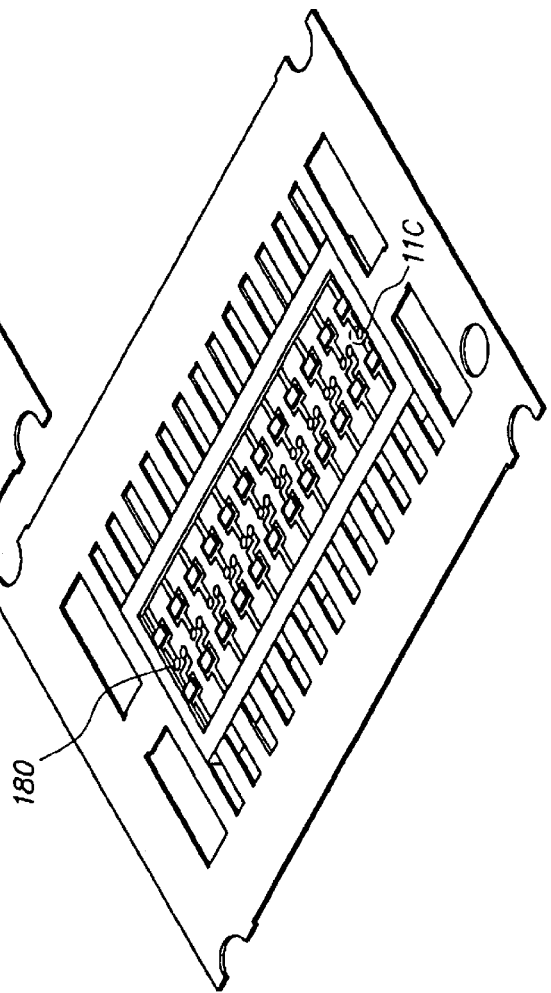

FIGS. 11A and 11B are top and bottom perspective views, respectively, of connection joints 180 formed on pads 116 and routing lines 148 by ball bonding.

Connection joints 180 are formed in openings 176 and contact pads 116 and routing lines 148, thereby electrically connecting pads 116 and routing lines 148. Connection joints 180 are composed of gold and are formed by thermosonic wire bonding. Preferably, the regions of pads 116 and routing lines 148 that are within or exposed by openings 176 are spot plated with silver having a thickness 3 microns. Silver is particularly well-suited for receiving a gold ball bond connection joint, and the nickel between the silver and the copper prevents the formation of brittle silver-copper intermetallic compounds. Thereafter, a capillary with a gold wire ball is positioned above opening 176, the capillary moves downward such that the wire ball enters opening 176 and contacts pad 116 and routing line 148 while the capillary is heated to about 150 to 200° C., and the capillary exerts a downward force of about 25 to 45 grams and provides horizontal ultrasonic oscillatory motions with a frequency of about 60 to 120 kHz. The combination of heat pressure and ultrasonic vibration places the wire ball in a soft state which is easy to deform and forms a ball bond that contacts and is metallurgically bonded to pad 116 and routing line 148. Thereafter, the capillary moves upward and away from the ball bond without exerting upward pressure on the ball bond, and the ball bond cools and solidifies. The solidified ball bond forms connection joint 180 and the capillary moves in a horizontal loop and then downward with a force of 70 to 90 grams to cut the gold wire from connection joint 180. The process is repeated to form other connection joints 180 for corresponding pairs of pads 116 and routing lines 148.

Connection joints 180 are formed in openings 176 and contact and electrically connect pads 116 with routing lines 148. Connection joints 180 contact and cover portions of pads 116 beneath openings 176 and outside routing lines 148, the surfaces of routing lines 148 that overlap and face away from pads 116, and the outer edges (or three peripheral sidewalls) of routing lines 148 that overlap and are orthogonal to pads 116. Thus, connection joints 180 provide robust, permanent electrical connections between pads 116 and routing lines 148.

Connection joints 180 are the only electrical conductors external to chip 110 that contact pads 116, adhesive 154 and connection joints 180 are the only materials external to chip 110 that contact pads 116, and adhesive 154 and connection joints 180 are the only materials that contact both pads 116 and routing lines 148.

Figure 11C:
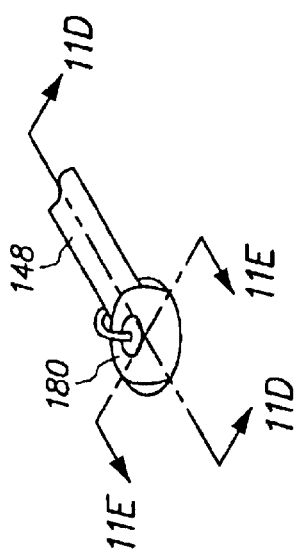
FIG. 11C is an enlarged perspective view of encircled detail 11C in FIG. 11B that shows a representative pad, routing line, opening and connection joint in greater detail.
Figure 11D:
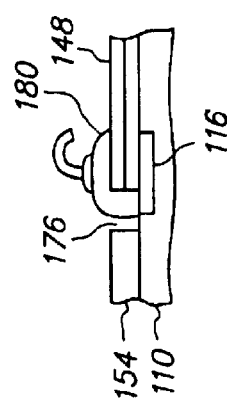
FIGS. 11D and 11E are enlarged cross-sectional views taken across lines 11D—11D and 11E—11E, respectively, in FIG. 11C.
Figure 11E:
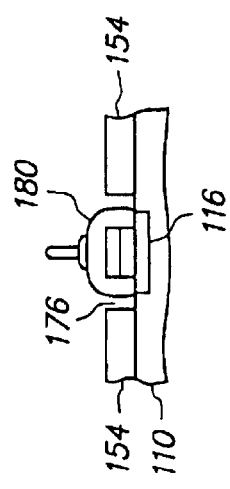

FIG. 11C is an enlarged perspective view of encircled detail 11C in FIG. 11B that shows a representative pad 116, routing line 148, opening 176 and connection joint 180 in greater detail, and FIGS. 11D and 11E are enlarged cross-sectional views taken across lines 11D—11D and 11E—11E, respectively, in FIG. 11C.

FIGS. 12A and 12B are top and bottom perspective views, respectively, of insulative base 182 disposed on the structure. Insulative base 182 is initially an epoxy paste that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is deposited on the exposed portions of metal traces 144, adhesive 154 and connection joints 180 using stencil printing. The epoxy paste is compliant enough at room temperature to conform to virtually any shape, and therefore fills the remaining space in openings 176. Thereafter, the epoxy paste is cured or hardened at relatively low temperature in the range of 100–250° C. to form insulative base 182 as a solid single-piece epoxy layer. Thereafter, a brief oxygen plasma cleaning step is applied to remove any epoxy residue on terminals 146 without removing an appreciable amount of encapsulant 156 or insulative base 182. Therefore, terminals 146 are exposed and available for connection to the next level assembly.

Insulative base 182 has a planar top surface and a thickness of 50 microns relative to adhesive 154. Therefore, terminals 146 protrude 70 microns (120−50) below and extend through insulative base 182.

Insulative base 182 contacts portions of inner side surfaces 174 adjacent to adhesive 154 and covers the entire surface area formerly occupied by central portion 126. As a result, encapsulant 156 and insulative base 182 in combination form insulative housing 184 that surrounds and encapsulates chip 110. Insulative housing 184 includes bottom surface 164 formed by peripheral portion 166 and insulative base 182. Thus, peripheral portion 166 forms a rectangular peripheral ledge of bottom surface 164, and insulative base 182 forms a recessed central portion of bottom surface 164. In addition, since terminals 146 protrude downwardly from insulative base 182, terminals 146 protrude downwardly from bottom surface 164.

Peripheral portion 166 protrudes 150 microns (200−50) below insulative base 182, whereas 110 terminals 146 protrude 70 microns below insulative base 182. Thus, peripheral portion 166 protrudes about twice as far below insulative base 182 as terminals 146 protrude below insulative base 182. However, since insulative base 182 forms a central portion of bottom surface 164 of insulative housing 184, and terminals 146 protrude below insulative base 182, terminals 146 protrude below bottom surface 164 of insulative housing 184, even though peripheral portion 166 forms a peripheral ledge of bottom surface 164 that protrudes below terminals 146.

Figure 13A:
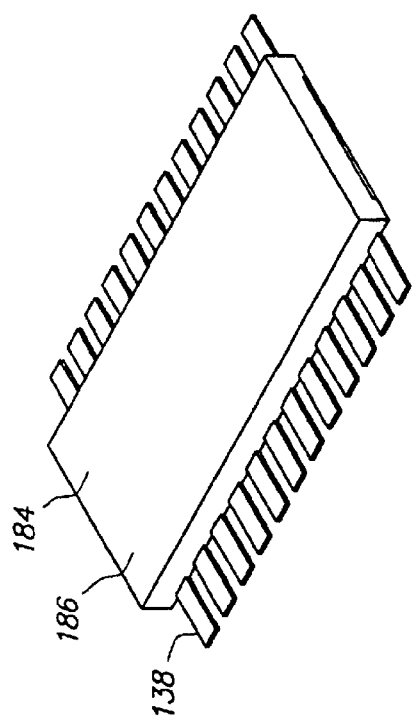
Figure 13B:
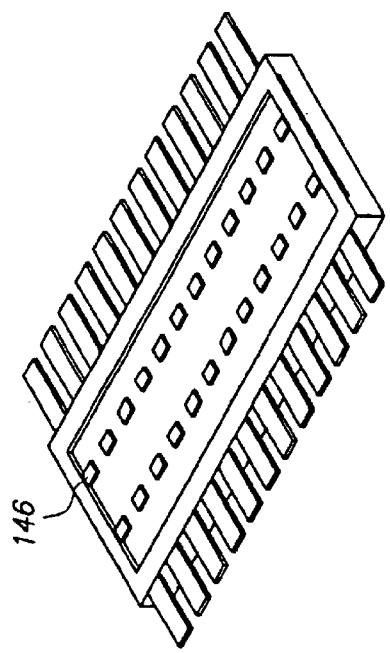

FIGS. 13A and 13B are top and bottom perspective views, respectively, of the structure after metal base 120 outside leads 138 and insulative housing 184 is removed. In other words, metal base 120 is selectively cut to remove all portions of metal base 120, except for leads 138, outside insulative housing 184, while leads 138 and insulative housing 184 remain intact. This can be accomplished using an excise blade that selectively cuts metal base 120 at predetermined regions adjacent to leads 138 and insulative housing 184. As a result, semiconductor package device 186 is singulated from the lead frame.

At this stage, device 186 includes chip 110, conductive traces 150, adhesive 154, connection joints 180 and insulative housing 184. Conductive traces 150 each include a lead 138 that protrudes laterally from and extends through a side surface 162 of insulative housing 184, a terminal 146 that protrudes downwardly from and extends through bottom surface 164 of insulative housing 184, and a routing line 148 within insulative housing 184 that is integral with an associated terminal 146 and contacts an associated lead 138 and connection joint 180. Conductive traces 150 are electrically connected to pads 116 by connection joints 180 in one-to-one relation, and are electrically isolated from one another. Leads 138 are arranged in opposing rows that protrude laterally from and extend through opposing side surfaces 162 and are disposed between top surface 160 and bottom surface 164. Terminals 146 are arranged as an array that protrudes downwardly from and extends through bottom surface 164 and is disposed inside inner side surfaces 174. Furthermore, leads 138 and terminals 146 are spaced and separated from one another outside insulative housing 184, and leads 138 and terminals 146 are electrically connected to one another and to pads 116 inside insulative housing 184 and outside chip 110.

Figure 14A:
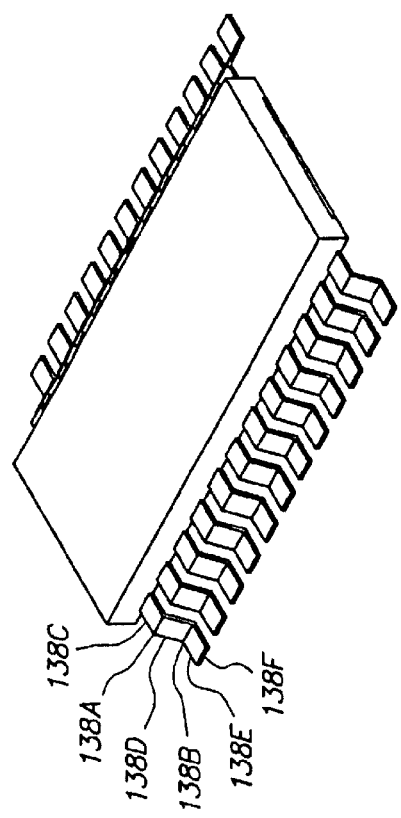
Figure 14B:
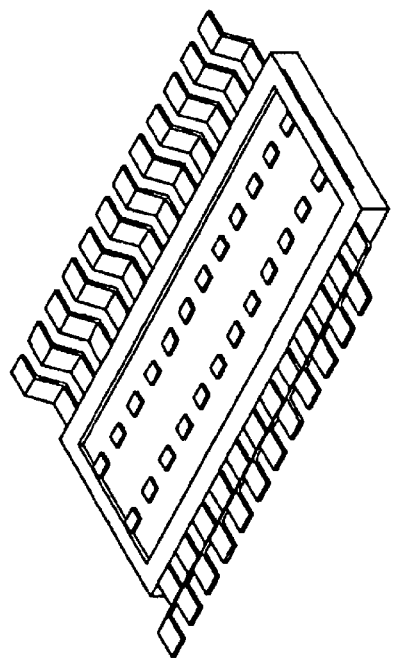

FIGS. 14A and 14B are top and bottom perspective views, respectively, of device 186 after leads 138 are bent. Leads 138 are bent at inner corners 138A and outer corners 138B using a conventional lead forming tool. As a result, leads 138 include inner lateral portions 138C between inner corners 138A and insulative housing 184, vertical portions 138D between corners 138A and 138B, and outer lateral portions 138E between outer corners 138B and distal ends 138F. Lateral portions 138C and 138E are parallel to top surface 160 and parallel to one another. Vertical portions 138D are sloped and extend laterally away from inner lateral portions 138C with increasing vertical distance from inner lateral portions 138C. Outer lateral portions 138E are disposed beneath terminals 146 and bottom surface 164. Thus, the lead bending operation moves distal ends 138F from between top surface 160 and bottom surface 164 to outside top surface 160 and bottom surface 164 such that distal ends 138F extend vertically beyond insulative housing 184. Furthermore, the lead bending operation converts leads 138 from straight planar leads to gullwing-shaped TSOP leads.

Figure 14C:
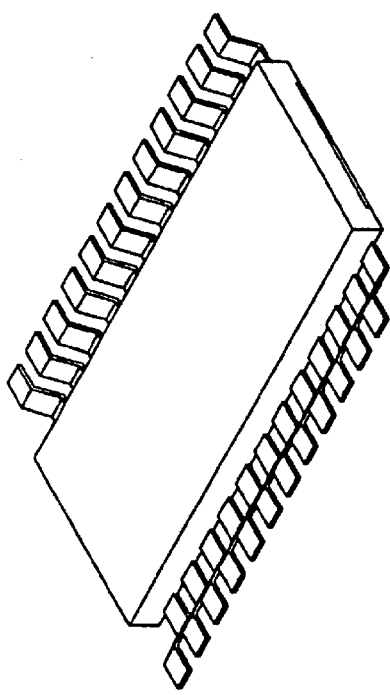
FIGS. 14C and 14D are top and bottom perspective views, respectively, that show an alternative arrangement to FIGS. 14A and 14B in which the leads are bent in the opposite direction.
Figure 14D:
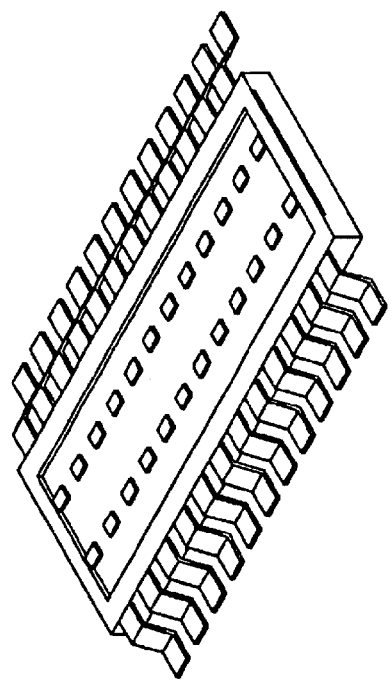

FIGS. 14C and 14D are top and bottom perspective views, respectively, of an alternative arrangement to FIGS. 14A and 14B in which leads 138 are bent in the opposite direction.

At this stage, it is preferred that an electrical test operation be performed on device 186. Preferably, chip 110 has already been tested and is a known-good-die (KGD), and therefore the electrical test operation may contain fewer steps. However, device 186 is electrically tested prior to shipment to assure that device 186 is a defect-free package. For instance, conductive traces 150 are tested to assure proper electrical interconnection with pads 116 and the absence of opens, shorts, near-opens and near-shorts. Parametric testing using capacitance measurements can be used to supplement open/short testing to assure that the nets meet the required specifications for high-speed communication. Chip testing can also be used to supplement the open/short testing to assure that chip 110 has not been damaged during the package manufacturing. The electrical testing provides important feedback to upstream processes and enhances the efficiency of downstream operations.

Small, tightly spaced terminal features and high circuit counts place a premium on contact test technology. Numerous contact test methods exist. For instance, test probes are used which deliver relatively uniform contact force over a wide range of displacements. However, alignment requirements mandate optical mapping and registration capability, and motion control in the X/Y and Z directions for fine geometries continues to be a challenge. Test sockets are well-suited for high volume, low cost manufacturing without the motion control complications of test probes. In high volume manufacturing, it is especially beneficial to design only a few universal test sockets with minimal variations so that the cost of customized test sockets for various packages can be minimized. Test sockets with standard configurations can receive devices that fit them. However, the test socket configuration may not match the desired electrode configuration for the device. As a result, difficult choices may arise between providing an expensive, customized test socket or providing the device with a less than optimal electrode configuration. Neither option is entirely satisfactory.

Advantageously, the present invention provides a semiconductor package device that has a first electrode configuration for the test socket and a second electrode configuration for the next level assembly. The first electrode configuration is provided by the leads, and the second electrode configuration is provided by the terminals. As a result, the device is flexible enough to accommodate test sockets and printed circuit boards with different electrical contact requirements. In other words, the leads can be optimized for mating with the test socket, and the terminals can be optimized for mating with the next level assembly. In this manner, the device can be tested using a standard test socket, and then attached to a printed circuit board with an entirely different contact arrangement than the test socket.

Figure 14E:
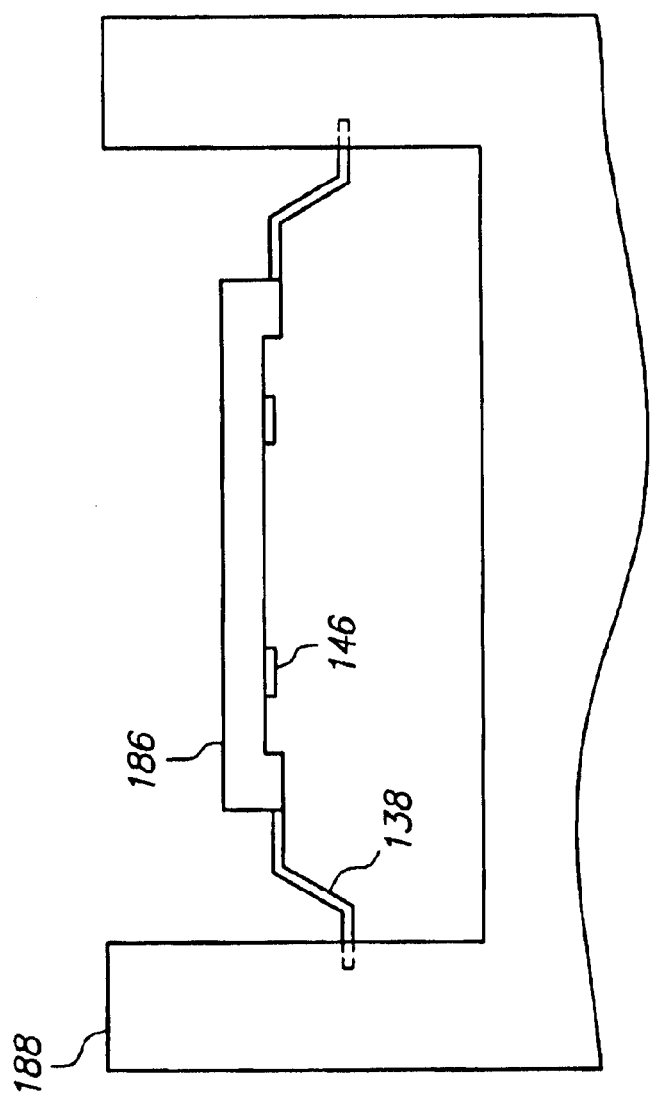
FIG. 14E is an enlarged side view of FIG. 14A that shows the device inserted into a test socket after the leads are bent.

FIG. 14E is an enlarged side view of FIG. 14A that shows device 186 inserted into test socket 188 after leads 138 are bent. Test socket 188 is a standard open-top TSOP test socket configured to receive standard TSOP leads. Accordingly, test socket 188 includes receptacles that receive and electrically contact leads 138 in one-to-one relation. Furthermore, since leads 138 are electrically connected to pads 116 by routing lines 148 and connection joints 180, and terminals 146 are integral with routing lines 148, it is not necessary for test socket 188 to electrically contact terminals 146. Instead, the testing assumes that if leads 138 make proper electrical contact with pads 116, then terminals 146 will do so as well. That is, if leads 138 pass the test, then terminals 146 should do so as well and therefore need not be separately tested. As a result, terminals 146 need not contact test socket 188.

When device 186 is inserted into test socket 188, leads 138 are the only electrical conductors of device 186 that test socket 188 contacts. Test socket 188 does not electrically contact any electrical conductor of device 186 other than leads 138. In addition, test socket 188 is the only piece of test equipment that contacts device 186. Test socket 188 is mounted on a test board (not shown).

After device 186 is inserted into test socket 188, device 186 is electrically tested using test signals transferred between leads 138 and test socket 188. The testing is performed without a test probe or any other test equipment besides test socket 188 that interfaces directly with device 186. Thus, all the test signals flow through leads 138 and test socket 188, and all the test signals enter and exit insulative housing 184 through side surfaces 162. The testing includes open/short testing, and may be supplemented by parametric testing and/or chip testing.

Thereafter, device 186 is removed from test socket 188. If device 186 passes the test, it can proceed to the next manufacturing step. Otherwise, device 186 can be diagnosed and possibly be reworked and retested. For illustration purposes, device 186 passes the test and proceeds to the next manufacturing step.

Figure 15A:
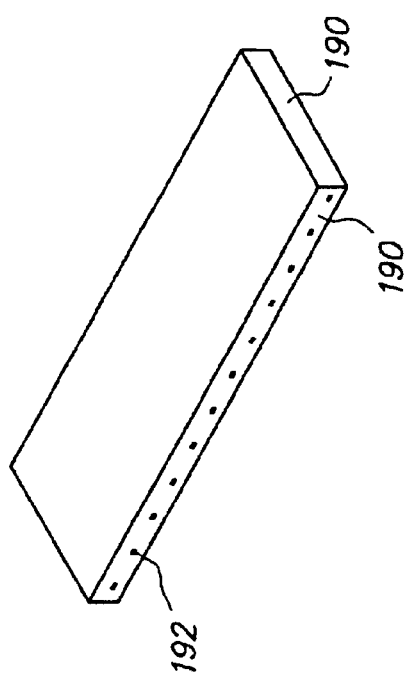
Figure 15B:
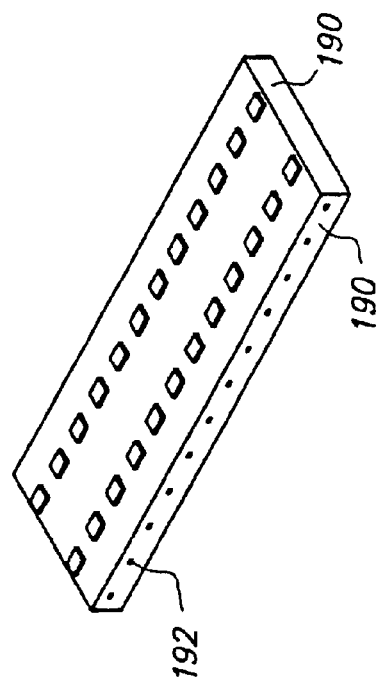

FIGS. 15A and 15B are top and bottom perspective views, respectively, of device 186 after a trimming operation removes peripheral portions of the structure. In particular, a laser is directed at bottom surface 164 and cuts through device 186 from bottom surface 164 to top surface 160 along the length and width of device 186 at the interface of encapsulant 156 and insulative base 182. In this manner, the laser cutting removes the peripheral portions of device 186 outside the surface area of insulative base 182. The laser cutting removes rectangular peripheral portions of top surface 160 and bottom surface 164 including peripheral portion 166. As a result, the laser cutting removes side surfaces 162 and creates new side surfaces 190 of insulative housing 184 that are adjacent to top surface 160 and bottom surface 164. The laser cutting effectively planarizes bottom surface 164 since the peripheral ledge previously provided by peripheral portion 166 is removed. The laser cutting also cuts through portions of routing lines 148 between leads 138 and terminals 146 as it cuts through insulative housing 184, thereby removing leads 138 and creating distal ends 192 of routing lines 148 that are coplanar with two opposing side surfaces 190 and are exposed. Similarly, edge portions of adhesive 154 (not shown) are coplanar with side surfaces 190 and are exposed.

The trimming is performed within the periphery of insulative housing 184 but outside the periphery of chip 110. Therefore, the trimming does not affect chip 110, terminals 146 or connection joints 180. Chip 110 remains encapsulated within insulative housing 184, and terminals 146 remain electrically connected to pads 116.

Furthermore, since the trimming removes leads 138, shrinks insulative housing 184 and permits terminals 146 to protrude beneath all portions of insulative housing 184, the trimming significantly alters the physical characteristics of device 186. In particular, the trimming converts device 186 from a TSOP package into a grid array package. Furthermore, the trimming converts device 186 into a chip scale package.

Figure 15C:
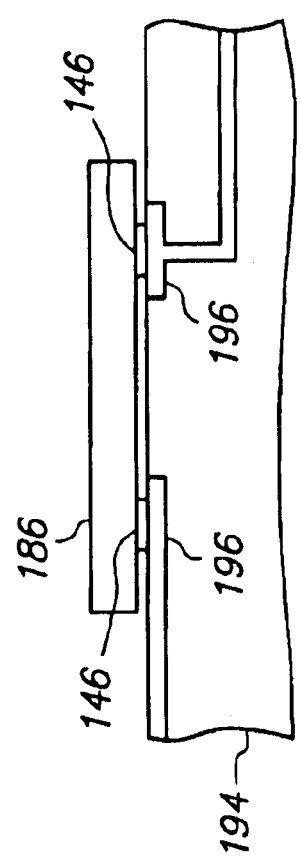
FIG. 15C is an enlarged side view of FIG. 15A that shows the device mounted on a printed circuit board after the device is trimmed.

FIG. 15C is an enlarged side view of FIG. 15A that shows device 186 mounted on printed circuit board 194 after device 186 is trimmed. Printed circuit board 194 is a substrate configured to receive the protruding electrode array provided by terminals 146. Accordingly, printed circuit board 194 includes conductive bond sites 196 that electrically contact terminals 146 in one-to-one relation. Preferably, conductive bond sites 196 are permanently attached to terminals 146 by solder, conductive adhesive or the like. Furthermore, since terminals 146 are electrically connected to pads 116 by routing lines 148 and connection joints 180, it is not necessary for printed circuit board 194 to contact leads 138 or routing lines 148. As a result, terminals 146 are the only portion of device 186 that contacts printed circuit board 194. If desired, an insulative adhesive can be underfilled between device 186 and printed circuit board 194 to enhance the mechanical attachment of the next level assembly.

The semiconductor package device described above is merely exemplary. Numerous other embodiments are contemplated.

The conductive traces can have various shapes and sizes. The conductive traces can overlap various portions of the pads, such as one peripheral edge and the center of the pad (FIG. 10C), two opposing peripheral edges and the center of the pad, three peripheral edges but not the center of the pad, two corners and the center of the pad, or four peripheral edges but not the center of the pad.

The conductive traces can be various conductive metals including copper, gold, nickel, aluminum, palladium, tin, combinations thereof, and alloys thereof. The preferred composition of the conductive traces will depend on the nature of the connection joints as well as design and reliability factors. Furthermore, those skilled in the art will understand that in the context of a semiconductor package device, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive traces may function as a signal, power or ground layer depending on the purpose of the associated chip pads. Likewise, the conductive traces can fan-in and fan-out.

The metal traces can be a single layer or multiple layers. For instance, the metal trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the metal trace can include a non-copper layer between a copper layer and the metal base. Suitable non-copper layers include nickel, gold, palladium and silver. After the metal trace is attached to the chip by the adhesive, a wet chemical etch can be applied that is highly selective of copper with respect to the non-copper layer to remove the copper base without removing the copper or non-copper layers. The non-copper layer provides an etch stop that prevents the wet chemical etch from removing the copper layer. Furthermore, it is understood that in the context of the present invention, the metal trace and the metal base are different metals (or metallic materials) even if a multi-layer metal trace includes a single layer that is similar to the metal base (such as the example described above).

The metal base can be various metals such as copper, gold, nickel, aluminum, palladium, tin, combinations thereof, and alloys thereof, and can be a single layer or multiple layers.

The metal base can be etched in numerous manners. For instance, portions of the metal base above the pads can be selectively etched to permit formation of the openings in the adhesive, and other portions of the metal base can remain intact and connected to the conductive traces. Alternatively, portions of the metal base above the pads can be selectively etched to permit formation of the openings, and other portions of the metal base that are isolated from the conductive traces and disposed within the periphery of the chip can remain intact and provide heat sinks.

The insulative base can be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. Organic fiber reinforcement may also be used in the epoxy resin. Fibers that may be used include aramid, polyester, polyamide, polyether-ether-ketone, polyimide, polyetherimide and polysulfone. The fiber reinforcement can be woven fabric, non-woven fabric or paper. Commercially available dielectric materials such as SPEED-BOARD C prepreg by W.L. Gore & Associates of Eau Claire, Wis. are suitable.

The insulative base can initially be formed outside the terminals such that the terminals are exposed. Alternatively, the insulative base can be deposited as an insulative layer that covers the terminals, and then portions of the insulative layer that cover the terminals can be selectively removed using a laser etch to expose the terminals without exposing portions of the routing lines that contact the leads. As another alternative, the insulative base can be deposited as an insulative layer that covers the terminals, and then a surface portion of the insulative layer can be globally removed using a plasma etch to expose the terminals without exposing portions of the routing lines that contact the leads.

The pads can have numerous shapes including a flat rectangular shape and a bumped shape. For instance, a bump-shaped pad may extend into the opening and may even extend above the conductive trace. The pads can either be partially or completely exposed prior to forming the connection joints. The pads can have a length and width that are larger than, equal to, or smaller than the diameter of the openings. Preferably, the pads and openings have the same or similar size, and a substantial portion of the pads is directly beneath the openings.

Numerous adhesives can be applied between the chip and the conductive trace. For instance, the adhesive can be applied as a paste, a laminated layer, or a liquid applied by screen-printing, spin-on, or spray-on. If paste or liquid adhesives are applied, the adhesive may contact the metal base, whereas if laminated adhesives are applied then no appreciable amount of adhesive may contact the metal base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable.

The openings can be formed in the adhesive either before or after mechanically attaching the chip to the conductive traces. For instance, the adhesive can be applied as a liquid or paste (A stage) to the bottom surface of the conductive traces, the adhesive can be partially cured (B stage), a back-side etch can form the openings in the adhesive, the partially cured adhesive can be brought into contact with the chip, and then the adhesive can be fully cured (C stage). Alternatively, the liquid or paste adhesive can be sandwiched between the chip and the conductive traces, the adhesive can be fully cured thereby mechanically fastening the chip to the conductive traces, and then a front-side etch can form the openings in the adhesive.

The openings can be formed with numerous etching techniques. For instance, the openings can be formed by laser direct write (without a mask) or a blanket plasma etch that removes portions of the adhesive not covered by the conductive traces. In addition, the openings can have a circular, ovalar, square, rectangular or other shape. The openings may be aligned with and expose single pads or a plurality of pads. Furthermore, the openings can have sidewalls with a wide variety of shapes and slopes including vertical sidewalls, tapered sidewalls, continuous sidewalls and stepped sidewalls.

The encapsulant can be formed using a wide variety of techniques including printing and transfer molding. For instance, the encapsulant can be an epoxy paste that is deposited and then cured or hardened. The encapsulant can be any of the adhesives mentioned above. Moreover, the encapsulant need not necessarily contact the chip. For instance, a glob-top coating can be deposited on the chip after mechanically attaching the chip to the conductive traces, and then the encapsulant can be formed on the glob-top coating.

The connection joints can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on the composition of the conductive traces as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

The conductive traces can be formed and attached to the chip by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/939,140 filed Aug. 24, 2001 by Charles W. C. Lin entitled "Semiconductor Chip Assembly with Interlocked Conductive Trace," and U.S. application Ser. No. 09/962,754 filed Sep. 24, 2001 by Charles W. C. Lin entitled "Method of Connecting a Conductive Trace and an Insulative Base to a Semiconductor Chip," each of which is incorporated by reference. Conventional wire bonding, TAB and flip-chip techniques can also be employed. With conventional wire bonding, TAB and flip-chip techniques, the connection joints between the conductive traces and the pads can be formed before the encapsulant is formed.

The terminals can have a wide variety of shapes and sizes and can be formed by a wide variety of techniques. See, for instance, U.S. application Ser. No. 09/972,796 filed Oct. 6, 2001 by Charles W. C. Lin et al. entitled "Method of Connecting a Bumped Compliant Conductive Trace and an Insulative Base to a Semiconductor Chip," and U.S. application Ser. No. 09/997,973 filed Nov. 29, 2001 by Charles W. C. Lin et al. entitled "Method of Connecting a Bumped Conductive Trace to a Semiconductor Chip," each of which is incorporated by reference. The terminals can be integral with or attached to the routing lines. For instance, the terminals can be solder balls deposited on planar routing lines. The terminals may include or exclude cavities, and can resemble columns, pillars, pins, bumps, balls, spheres, hemispheres or other shapes.

The terminals can be disposed inside or outside the periphery of the chip, and if inside the periphery of the chip, over a peripheral portion of the chip outside the pads or over a central portion of the chip inside the pads. Thus, the terminals can fan-in and fan-out relative to the pads. The terminals can be connected to or mounted on a wide variety of substrates including printed circuit boards, chip packages and unpackaged chips.

A soldering material or solder balls can be deposited on the terminals by plating or printing or placement techniques if required for the next level assembly. Moreover, the terminals can be formed with a solder surface layer, thereby rendering additional soldering material unnecessary. However, the next level assembly may not require that the device contain solder. For instance, in land grid array (LGA) packages, the soldering material is normally provided by the panel rather than the package.

The semiconductor package device of the present invention can house a wide variety of including microprocessors, field programmable gate arrays (FPGAs); logic drivers, dynamic random access memories (DRAMs), static random access memories (SRAMs) and optoelectronic chips.

For instance, if an optoelectronic chip is employed with a light sensitive cell and pads on the upper surface, the pads, adhesive, conductive traces and connection joints are disposed outside the light sensitive cell, and the insulative base is a transparent epoxy layer that is deposited on the light sensitive cell, then the light sensitive cell will receive light from the external environment that impinges upon and passes through the insulative base.

The trimming operation can be performed by laser cutting, mechanical sawing, chemical etching, and combinations thereof. The trimming operation need not necessarily trim the insulative housing. For instance, the trimming operation can be applied solely to the leads to remove portions of the leads that extend outside the top and bottom surfaces of the insulative housing such that distal ends of the leads protrude from the insulative housing and are disposed between the top and bottom surfaces of the insulative housing. For example, the trimming operation can cut gullwing-shaped leads at the inner lateral portions, thereby removing the two bent corners, the vertical portions and the outer lateral portions. Furthermore, the trimming operation may partially or completely remove the leads. For example, the trimming operation can cut the routing lines between the terminals and the leads, thereby trimming and excising the leads.

The trimming operation can be omitted. In some instances it may be desirable to leave the leads intact, particularly if the terminals are omitted or not used for the next level assembly. The leads rather than the terminals can be used for the next level assembly. For example, the terminals can provide bond sites for an additional chip (or chips) that is flip-chip bonded to the device. Preferably, the additional chip fits within the cavity defined by the peripheral ledge of the bottom surface of the insulative housing so that the overall dimensions of the device are not significantly affected. The device with the additional chip provides a multichip module. As another example, the terminals can provide bond sites for the terminals of another device that has been trimmed such that the trimmed device fits within the cavity defined by the peripheral ledge of the bottom surface of the insulative housing of the untrimmed device. For instance, a trimmed device shown in FIGS. 15A and 15B can be inserted into the bottom surface cavity of an untrimmed device shown in FIGS. 14A and 14B such that the terminals of the trimmed and untrimmed devices are aligned and electrically contact one another, and the peripheral side surfaces of the trimmed device are adjacent to the inner side surfaces of the peripheral ledge of the untrimmed device. Preferably, either the trimmed or untrimmed device has solder-coated bumped terminals and the other device is a land grid array. The devices in combination provide a three-dimensional stacked semiconductor package device.

The "upper" and "lower" surfaces of the chip and the "top" and "bottom" surfaces of the insulative housing do not depend on the orientation of the device, as will be readily apparent to those skilled in the art. For instance, the upper surface of the chip includes the pads, regardless of whether the chip is inverted, and regardless of whether the device is inverted and/or mounted on a printed circuit board. Similarly, the terminals extend through the "bottom" surface of the insulative housing, and the leads extend through the "side" surfaces of the insulative housing, regardless of whether the device is inverted, rotated or slanted. Likewise, the device is shown with a single orientation throughout the drawings for ease of comparison between the figures, although the device may be inverted at various manufacturing stages. For instance, the device should be inverted so that the bottom surface faces upward when the epoxy paste that forms the insulative base is deposited on the structure to assist the epoxy paste with filling the remaining space in the openings in the adhesive.

The semiconductor package device of the present invention can have a wide variety of packaging formats as required by the test socket and/or next level assembly. For instance, the leads can be configured so that the untrimmed device is a surface mount technology (SMT) package such as a small outline package (SOP), thin small outline package (TSOP), quad flat package (QFP), plastic leadless chip carrier (PLCC) or small outline J-lead package (SOJ). The leads can also be configured so that the untrimmed device is a through-hole package such as a dual in-line package (DIP), single in-line package (SIP) or zig-zag in-line package (ZIP). The terminals can be configured so that the trimmed device is a grid array such as a ball grid array (BGA), column grid array (CGA), land grid array (LGA) or pin grid array (PGA).

Advantageously, the semiconductor package device of the present invention is reliable and inexpensive. The encapsulant and the insulative base protect the chip from handling damage and provide a known dielectric barrier for the conductive traces. The encapsulant also provides critical mechanical support for the conductive traces after the metal base is etched. The insulative base prevents solder reflow at the bottom surface from contacting or electrically shorting the underlying routing lines. The terminals yield enhanced reliability for the next level assembly that exceeds that of conventional BGA packages. The mode of the connection between the chip and the conductive traces shifts from the initial mechanical coupling to metallurgical coupling to assure sufficient metallurgical bond strength. Furthermore, the conductive traces can be mechanically and metallurgically coupled to the chip without wire bonding, TAB or solder joints, although the process is flexible enough to accommodate these techniques if desired. As a result, the device significantly enhances throughput, yield and performance characteristics compared to conventional packaging techniques. Moreover, the device is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A semiconductor package device, comprising:
   an insulative housing with a top surface, a bottom surface, and a peripheral side surface between the top and bottom surfaces, wherein the insulative housing includes a first single-piece housing portion and a second single-piece housing portion, and the first single-piece housing portion is not integral with the second single-piece housing portion;
   a semiconductor chip within the insulative housing, wherein the chip includes an upper surface and a lower surface, and the upper surface includes a conductive pad;
   a terminal that protrudes downwardly from and extends through the bottom surface and is electrically connected to the pad; and
   a lead that protrudes laterally from and extends through the side surface and is electrically connected to the pad, wherein the first single-piece housing portion contacts the lead and is spaced from the terminal, the second single-piece housing portion contacts the first single-piece housing portion and the terminal, the terminal and the lead are spaced and separated from one another outside the insulative housing, and the terminal and the lead are electrically connected to one another inside the insulative housing and outside the chip.

2. The device of claim 1, wherein the first single-piece housing portion provides the top surface, the side surface and a peripheral portion of the bottom surface, and the second single-piece housing portion provides a central portion of the bottom surface within the peripheral portion of the bottom surface.

3. The device of claim 1, wherein the first single-piece housing portion contacts the lower surface.

4. The device of claim 1, wherein the insulative housing consists of the first and second single-piece housing portions.

5. The device of claim 1, wherein the terminal is the only electrical conductor that extends through the top or bottom surfaces and is electrically connected to the pad.

6. The device of claim 1, wherein the terminal is a plated metal.

7. The device of claim 1, wherein the terminal is within a periphery of the chip, and the lead is outside the periphery of the chip.

8. The device of claim 1, wherein the device is devoid of an electrical conductor that extends through the top surface and is electrically connected to the pad.

9. The device of claim 1, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

10. The device of claim 1, wherein the device is devoid of wire bonds, TAB leads and solder joints.

11. A semiconductor package device, comprising:
an insulative housing with a top surface, a bottom surface, and a peripheral side surface between the top and bottom surfaces, wherein the insulative housing consists of a first single-piece housing portion and a second single-piece housing portion, and the first single-piece housing portion is not integral with the second single-piece housing portion;
a semiconductor chip within and surrounded by the insulative housing, wherein the chip includes an upper surface and a lower surface, the upper surface includes a conductive pad, the upper surface faces towards the bottom surface and faces away from the top surface, and the insulative housing contacts the lower surface;
a terminal that protrudes downwardly from and extends through the bottom surface and is spaced from the side surface and is electrically connected to the pad; and
a lead that protrudes laterally from and extends through the side surface and is electrically connected to the pad, wherein the first single-piece housing portion contacts the lower surface and the lead and is spaced from the terminal, the second single-piece housing portion contacts the first single-piece housing portion and the terminal, the terminal and the lead are spaced and separated from one another outside the insulative housing, and the terminal and the lead are electrically connected to one another inside the insulative housing and outside the chip.

12. The device of claim 11, wherein the second single-piece housing portion is farther from the top surface than the lower surface is from the top surface.

13. The device of claim 11, wherein the first single-piece housing portion provides the top surface, the side surface and a peripheral portion of the bottom surface, and the second single-piece housing portion provides a central portion of the bottom surface within the peripheral portion of the bottom surface.

14. The device of claim 13, wherein the peripheral portion of the bottom surface is outside a periphery of the chip, and the central portion of the bottom surface is within and outside the periphery of the chip.

15. The device of claim 11, wherein the first single-piece housing portion is a transfer molded material, and the second single-piece housing portion is not a transfer molded material.

16. The device of claim 11, wherein the second single-piece housing portion includes first and second opposing surfaces, the first surface contacts the lead and the second surface provides a portion of the bottom surface.

17. The device of claim 11, wherein the terminal is within a periphery of the chip and outside a periphery of the pad, and the lead is outside the periphery of the chip.

18. The device of claim 11, wherein the terminal is integral with a routing line that is plated on the lead inside the insulative housing, outside a periphery of the terminal and outside a periphery of the chip.

19. The device of claim 11, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

20. The device of claim 11, wherein the device is devoid of wire bonds, TAB leads and solder joints.

21. A semiconductor package device, comprising:
an insulative housing with a top surface, a bottom surface, and peripheral side surfaces between the top and bottom surfaces, wherein the bottom surface includes a peripheral portion adjacent to the side surfaces and a central portion within the peripheral portion and spaced from the side surfaces, and the peripheral portion protrudes downwardly from the central portion;
a semiconductor chip within and surrounded by the insulative housing, wherein the chip includes an upper surface and a lower surface, and the upper surface includes a conductive pad;
a terminal that protrudes downwardly from and extends through the central portion of the bottom surface and is spaced from the side surfaces and is electrically connected to the pad; and
a lead that protrudes laterally from and extends through one of the side surfaces and is electrically connected to the pad, wherein the terminal and the lead are spaced and separated from one another outside the insulative housing, and the terminal and the lead are electrically connected to one another inside the insulative housing and outside the chip.

22. The device of claim 21, wherein the insulative housing consists of a first single-piece housing portion that contacts the lower surface and the lead and is spaced from the terminal and a second single-piece housing portion that contacts the first single-piece housing portion and the terminal, and the first single-piece housing portion is not integral with the second single-piece housing portion.

23. The device of claim 22, wherein the first single-piece housing portion provides the top surface, the side surfaces and the peripheral portion of the bottom surface, and the second single-piece housing portion provides the central portion of the bottom surface.

24. The device of claim 23, wherein the peripheral portion of the bottom surface is outside a periphery of the chip, and the central portion of the bottom surface is within and outside the periphery of the chip.

25. The device of claim 22, wherein the first single-piece housing portion is a transfer molded material, and the second single-piece housing portion is not a transfer molded material.

26. The device of claim 21, wherein the peripheral portion of the bottom surface protrudes a first distance below the central portion of the bottom surface, the terminal protrudes a second distance below the central portion of the bottom surface, and the first distance is greater than the second distance.

27. The device of claim 21, wherein the peripheral portion of the bottom surface is shaped as a rectangular peripheral ledge.

28. The device of claim 21, wherein the terminal is within a periphery of the chip, and the peripheral portion of the bottom surface is outside the periphery of the chip.

29. The device of claim 21, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the central portion of the bottom surface, and the leads are arranged as TS OP leads that protrude laterally from and extend through two of the side surfaces that oppose one another.

30. The device of claim 21, wherein the device is devoid of wire bonds, TAB leads and solder joints.

31. A semiconductor package device, comprising:
an insulative housing with a top surface, a bottom surface, and four peripheral side surfaces between the top and bottom surfaces, wherein the bottom surface includes a peripheral portion shaped as a rectangular peripheral ledge adjacent to the side surfaces and a recessed central portion within the peripheral portion and spaced from the side surfaces, and the peripheral portion protrudes downwardly from the central portion and extends a first distance below the central portion;
a semiconductor chip within and surrounded by the insulative housing, wherein the chip includes an upper surface and a lower surface, the upper surface includes a conductive pad, the upper surface faces towards the bottom surface and faces away from the top surface, and the insulative housing contacts the lower surface;
a terminal that protrudes downwardly from and extends through the central portion of the bottom surface and is spaced from the side surfaces and is electrically connected to the pad, wherein the terminal extends a second distance below the central portion, and the first distance is greater than the second distance; and
a lead that protrudes laterally from and extends through one of the side surfaces and is electrically connected to the pad, wherein the terminal and the lead are spaced and separated from one another outside the insulative housing, and the terminal and the lead are electrically connected to one another inside the insulative housing and outside the chip.

32. The device of claim 31, wherein the insulative housing consists of a first single-piece housing portion that contacts the lower surface and the lead and is spaced from the terminal and a second single-piece housing portion that contacts the first single-piece housing portion and the terminal and the first single-piece housing portion is not integral with the second single-piece housing portion.

33. The device of claim 32, wherein the first single-piece housing portion provides the top surface, the side surfaces and the peripheral portion of the bottom surface, and the second single-piece housing portion provides the central portion of the bottom surface.

34. The device of claim 33, wherein the peripheral portion of the bottom surface is outside a periphery of the chip, and the central portion of the bottom surface is within and outside the periphery of the chip.

35. The device of claim 32, wherein the first single-piece housing portion is a transfer molded material, and the second single-piece housing portion is not a transfer molded material.

36. The device of claim 31, wherein the first distance is about twice the second distance.

37. The device of claim 31, wherein the peripheral portion of the bottom surface is integral with the side surfaces and non-integral with the central portion of the bottom surface.

38. The device of claim 31, wherein the terminal is within a periphery of the chip, and the peripheral portion of the bottom surface is outside the periphery of the chip.

39. The device of claim 31, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the central portion of the bottom surface, and the leads are arranged as TSOP leads that protrude laterally from and extend through two of the side surfaces that oppose one another.

40. The device of claim 31, wherein the device is devoid of wire bonds, TAB leads and solder joints.

41. A semiconductor package device, comprising:
an insulative housing with a top surface, a bottom surface, and a peripheral side surface between the top and bottom surfaces, wherein the insulative housing includes a first single-piece housing portion that contacts the lead and is spaced from the terminal and a second single-piece housing portion that contacts the first single-piece housing portion and the terminal, and the first single-piece housing portion is not integral with the second single-piece housing portion;
a semiconductor chip within the insulative housing, wherein the chip includes an upper surface and a lower surface, and the upper surface includes a conductive pad;
a terminal that protrudes downwardly from and extends through the bottom surface and is electrically connected to the pad; and
a lead that protrudes laterally from and extends through the side surface and is electrically connected to the pad, wherein the lead includes a recessed portion that contacts and extends into the insulative housing and is spaced from the top and bottom surfaces and does not overlap the chip and a non-recessed portion that contacts and extends outside the insulative housing and is adjacent to the recessed portion and the bottom surface, the terminal and the lead are spaced and separated from one another outside the insulative housing, and the terminal and the lead are electrically connected to one another inside the insulative housing and outside the chip.

42. The device of claim 41, wherein the first single-piece housing portion provides the top surface, the side surface and a peripheral portion of the bottom surface, and the second single-piece housing portion provides a central portion of the bottom surface within the peripheral portion of the bottom surface.

43. The device of claim 42, wherein the first single-piece housing portion contacts the lower surface.

44. The device of claim 42, wherein the insulative housing consists of the first and second single-piece housing portions.

45. The device of claim 41, wherein the terminal is the only electrical conductor that extends through the top or bottom surfaces and is electrically connected to the pad.

46. The device of claim 41, wherein the terminal is a plated metal.

47. The device of claim 41, wherein the terminal is within a periphery of the chip, and the lead is outside the periphery of the chip.

48. The device of claim 41, wherein the device is devoid of an electrical conductor that extends through the top surface and is electrically connected to the pad.

49. The device of claim 41, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

50. The device of claim 41, wherein the device is devoid of wire bonds, TAB leads and solder joints.

51. A semiconductor package device, comprising:
an insulative housing with a top surface, a bottom surface, and a peripheral side surface between the top and bottom surfaces, wherein the insulative housing consists of a first single-piece housing portion that contacts the lower surface and the lead and is spaced from the terminal and a second single-piece housing portion that contacts the first single-piece housing portion and the terminal, and the first single-piece housing portion is not integral with the second single-piece housing portion;
a semiconductor chip within and surrounded by the insulative housing, wherein the chip includes an upper surface and a lower surface, the upper surface includes a conductive pad, and the upper surface faces towards the bottom surface and faces away from the top surface;
a terminal that protrudes downwardly from and extends through the bottom surface and is spaced from the side surface and is electrically connected to the pad; and
a lead that protrudes laterally from and extends through the side surface and is electrically connected to the pad, wherein the lead includes a recessed portion that contacts and extends into the insulative housing and is spaced from the top and bottom surfaces and does not overlap the chip and a non-recessed portion that contacts and extends outside the insulative housing and is adjacent to the recessed portion and the bottom surface, the terminal and the lead are spaced and separated from one another outside the insulative housing, and the terminal and the lead are electrically connected to one another inside the insulative housing and outside the chip.

52. The device of claim 51, wherein the second single-piece housing portion contacts the upper surface and is spaced from the lower surface.

53. The device of claim 52, wherein the first single-piece housing portion provides the top surface, the side surface and a peripheral portion of the bottom surface, and the second single-piece housing portion provides a central portion of the bottom surface within the peripheral portion of the bottom surface.

54. The device of claim 53, wherein the peripheral portion of the bottom surface is outside a periphery of the chip, and the central portion of the bottom surface is within and outside the periphery of the chip.

55. The device of claim 52, wherein the first single-piece housing portion is a transfer molded material, and the second single-piece housing portion is not a transfer molded material.

56. The device of claim 52, wherein the second single-piece housing portion includes first and second opposing surfaces, the first surface contacts the lead and the second surface provides a portion of the bottom surface.

57. The device of claim 51, wherein the terminal is within a periphery of the chip and outside a periphery of the pad, and the lead is outside the periphery of the chip.

58. The device of claim 51, wherein the terminal is integral with a routing line that is plated on the lead inside the insulative housing, outside a periphery of the terminal and outside a periphery of the chip.

59. The device of claim 51, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

60. The device of claim 51, wherein the device is devoid of wire bonds, TAB leads and solder joints.

61. A semiconductor package device, comprising:
an insulative housing with a top surface, a bottom surface, and a peripheral side surface between the top and bottom surfaces;
a semiconductor chip within the insulative housing, wherein the chip includes an upper surface and a lower surface, and the upper surface includes a conductive pad;
a routing line within the insulative housing that overlaps and is electrically connected to the pad;
a terminal that protrudes downwardly from and is integral with the routing line, protrudes downwardly from and extends through the bottom surface and is electrically connected to the pad; and
a lead that protrudes downwardly from and contacts and is not integral with the routing line, protrudes laterally from and extends through the side surface and is electrically connected to the pad, wherein the terminal and the load are spaced and separated from one another outside the insulative housing, and the terminal and the lead are electrically connected to one another by the routing line inside the insulative housing and outside the chip.

62. The device of claim 61, wherein the insulative housing includes a first single-piece housing portion that contacts the routing line and the lead and is spaced from the terminal and a second single-piece housing portion that contacts the first single-piece housing portion, the routing line and the terminal, and the first single-piece housing portion is not integral with the second single-piece housing portion.

63. The device of claim 62, wherein the first single-piece housing portion contacts the lower surface.

64. The device of claim 62, wherein the insulative housing consists of the first and second single-piece housing portions.

65. The device of claim 61, wherein the terminal is the only electrical conductor that extends through the top or bottom surfaces and is electrically connected to the pad.

66. The device of claim 61, wherein the routing line and the terminal are a plated metal.

67. The device of claim 61, wherein the terminal is within a periphery of the chip, the routing line is within and outside the periphery of the chip, and the lead is outside the periphery of the chip.

68. The device of claim 61, wherein the device is devoid of an electrical conductor that extends through the top surface and is electrically connected to the pad.

69. The device of claim 61, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

70. The device of claim 61, wherein the device is devoid of wire bonds, TAB leads and solder joints.

71. A semiconductor package device, comprising:

an insulative housing with a top surface, a bottom surface, and a peripheral side surface between the top and bottom surfaces;

a semiconductor chip within and surrounded by the insulative housing, wherein the chip includes an upper surface and a lower surface, the upper surface includes a conductive pad, the upper surface faces towards the bottom surface and faces away from the top surface, and the insulative housing contacts the lower surface;

a routing line within and surrounded by the insulative housing, wherein the routing line overlaps and is electrically connected to the pad;

a terminal that protrudes downwardly from and is integral with the routing line, protrudes downwardly from and extends through the bottom surface, is spaced from the side surface and is electrically connected to the pad; and a lead that protrudes downwardly from and contacts and is not integral with the routing line, protrudes laterally from and extends through the side surface and is electrically connected to the pad, wherein the terminal and the lead are spaced and separated from one another outside the insulative housing, and the terminal and the lead are electrically connected to one another inside the insulative housing and outside the chip.

72. The device of claim 71, wherein the insulative housing consists of a first single-piece housing portion that contacts the lower surface, the routing line and the lead and is spaced from the terminal and a second single-piece housing portion that contacts the first single-piece housing portion, the routing line and the terminal and the first single-piece housing portion is not integral with the second single-piece housing portion.

73. The device of claim 72, wherein the first single-piece housing portion provides the top surface, the side surface and a peripheral portion of the bottom surface, and the second single-piece housing portion provides a central portion of the bottom surface within the peripheral portion of the bottom surface.

74. The device of claim 73, wherein the peripheral portion of the bottom surface is outside a periphery of the chip, and the central portion of the bottom surface is within and outside the periphery of the chip.

75. The device of claim 72, wherein the first single-piece housing portion is a transfer molded material, and the second single-piece housing portion is not a transfer molded material.

76. The device of claim 72, wherein the second single-piece housing portion includes first and second opposing surfaces, the first surface contacts the routing line and the second surface provides a portion of the bottom surface.

77. The device of claim 71, wherein the terminal is within a periphery of the chip and outside a periphery of the pad, the routing line is within and outside the periphery of the chip, and the lead is outside the periphery of the chip.

78. The device of claim 71, wherein the routing line is plated on the lead inside the insulative housing, outside a periphery of the terminal and outside a periphery of the chip.

79. The device of claim 71, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

80. The device of claim 71, wherein the device is devoid of wire bonds, TAB leads and solder joints.

81. A semiconductor package device, comprising:

an insulative housing with a top surface, a bottom surface, and peripheral side surfaces between the top and bottom surfaces, wherein the bottom surface includes a peripheral portion adjacent to the side surfaces and a central portion within the peripheral portion and spaced from the side surfaces, and the peripheral portion protrudes downwardly from the central portion;

a semiconductor chip within and surrounded by the insulative housing, wherein the chip includes an upper surface and a lower surface, and the upper surface includes a conductive pad;

a routing line within and surrounded by the insulative housing, wherein the routing line overlaps and is electrically connected to the pad;

a terminal that protrudes downwardly from and is integral with the routing line, protrudes downwardly from and extends through the central portion of the bottom surface, is spaced from the side surfaces and is electrically connected to the pad; and a lead that protrudes downwardly from and contacts and is not integral with the routing line, protrudes laterally from and extends through one of the side surfaces and is electrically connected to the pad, wherein the terminal and the lead are spaced and separated from one another outside the insulative housing, and the terminal and the lead are electrically connected to one another by the routing line inside the insulative housing and outside the chip.

82. The device of claim 81, wherein the insulative housing consists of a first single-piece housing portion that contacts the lower surface, the routing line and the lead and is spaced from the terminal and a second single-piece housing portion that contacts the first single-piece housing portion, the routing line and the terminal, and the first single-piece housing portion is not integral with the second single-piece housing portion.

83. The device of claim 82, wherein the first single-piece housing portion provides the top surface, the side surfaces and the peripheral portion of the bottom surface, and the second single-piece housing portion provides the central portion of the bottom surface.

84. The device of claim 83, wherein the peripheral portion of the bottom surface is outside a periphery of the chip, and the central portion of the bottom surface is within and outside the periphery of the chip.

85. The device of claim 82, wherein the first single-piece housing portion is a transfer molded material, and the second single-piece housing portion is not a transfer molded material.

86. The device of claim 81, wherein the peripheral portion of the bottom surface protrudes a first distance below the central portion of the bottom surface, the terminal protrudes a second distance below the central portion of the bottom surface, and the first distance is greater than the second distance.

87. The device of claim 81, wherein the peripheral portion of the bottom surface is shaped as a rectangular peripheral ledge.

88. The device of claim 81, wherein the terminal is within a periphery of the chip, the routing line is within and outside the periphery of the chip, the lead is outside the periphery of the chip, and the peripheral portion of the bottom surface is outside the periphery of the chip.

89. The device of claim 81, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the central portion of the bottom surface, and the leads are arranged as TSOP leads that protrude laterally from and extend through two of the side surfaces that oppose one another.

90. The device of claim 81, wherein the device is devoid of wire bonds, TAB leads and solder joints.

91. A semiconductor package device, comprising:
an insulative housing with a top surface, a bottom surface, and four peripheral side surfaces between the top and bottom surfaces, wherein the bottom surface includes a peripheral portion shaped as a rectangular peripheral ledge adjacent to the side surfaces and a recessed central portion within the peripheral portion and spaced from the side surfaces, and the peripheral portion protrudes downwardly from the central portion and extends a first distance below the central portion;
a semiconductor chip within and surrounded by the insulative housing, wherein the chip includes an upper surface and a lower surface, the upper surface includes a conductive pad, the upper surface faces towards the bottom surface and faces away from the top surface, and the insulative housing contacts the lower surface;
a routing line within and surrounded by the insulative housing, wherein the routing line overlaps and is electrically connected to the pad;
a terminal that protrudes downwardly from and is integral with the routing line, protrudes downwardly from and extends through the central portion of the bottom surface, is spaced from the side surfaces and is electrically connected to the pad, wherein the terminal extends a second distance below the central portion, and the first distance is greater than the second distance; and
a lead that protrudes downwardly from and contacts and is not integral with the routing line, protrudes laterally from and extends through one of the side surfaces and is electrically connected to the pad, wherein the terminal and the lead are spaced and separated from one another outside the insulative housing, and the terminal and the lead are electrically connected to one another by the routing line inside the insulative housing and outside the chip.

92. The device of claim 91, wherein the insulative housing consists of a first single-piece housing portion that contacts the lower surface, the routing line and the lead and is spaced from the terminal and a second single-piece housing portion that contacts the first single-piece housing portion, the routing line and the terminal, and the first single-piece housing portion is not integral with the second single-piece housing portion.

93. The device of claim 92, wherein the first single-piece housing portion provides the top surface, the side surfaces and the peripheral portion of the bottom surface, and the second single-piece housing portion provides the central portion of the bottom surface.

94. The device of claim 93, wherein the peripheral portion of the bottom surface is outside a periphery of the chip, and the central portion of the bottom surface is within and outside the periphery of the chip.

95. The device of claim 92, wherein the first single-piece housing portion is a transfer molded material, and the second single-piece housing portion is not a transfer molded material.

96. The device of claim 91, wherein the first distance is about twice the second distance.

97. The device of claim 91, wherein the peripheral portion of the bottom surface is integral with the side surfaces and non-integral with the central portion of the bottom surface.

98. The device of claim 91, wherein the terminal is within a periphery of the chip, the routing line is within and outside the periphery of the chip, the lead is outside the periphery of the chip, and the peripheral portion of the bottom surface is outside the periphery of the chip.

99. The device of claim 91, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the central portion of the bottom surface, and the leads are arranged as TSOP leads that protrude laterally from and extend through two of the side surfaces that oppose one another.

100. The device of claim 91, wherein the device is devoid of wire bonds, TAB leads and solder joints.

101. A semiconductor package device, comprising:
an insulative housing with a top surface, a bottom surface, and a peripheral side surface between the top and bottom surfaces, wherein the insulative housing includes a first single-piece housing portion that contacts the lead and is spaced from the terminal and a second single-piece housing portion that contacts the first single-piece housing portion and the terminal, and the first single-piece housing portion is not integral with the second single-piece housing portion;
a semiconductor chip within the insulative housing, wherein the chip includes an upper surface and a lower surface, and the upper surface includes a conductive pad;
a terminal that protrudes downwardly from and extends through the bottom surface and is electrically connected to the pad; and
a lead that protrudes laterally from and extends through the side surface and is electrically connected to the pad, wherein the lead includes a recessed portion that extends into the insulative housing and is spaced from the top and bottom surfaces and a non-recessed portion that extends outside the insulative housing and is adjacent to the recessed portion and contacts the insulative housing, the recessed and non-recessed portions each include four outer surfaces, three of the outer surfaces of the recessed and non-recessed portions that do not face in the same direction as the bottom surface are coplanar with one another where the recessed and non-recessed portions are adjacent to one another, one of the outer surfaces of the recessed and non-recessed portions that face in the same direction as the bottom surface are not coplanar with one another where the recessed and non-recessed portions are adjacent to one another, the terminal and the lead are spaced and separated from one another outside the insulative housing, and the terminal and the lead are electrically connected to one another inside the insulative housing and outside the chip.

102. The device of claim 101, wherein the first single-piece housing portion provides the top surface, the side surface and a peripheral portion of the bottom surface, and the second single-piece housing portion provides a central portion of the bottom surface within the peripheral portion of the bottom surface.

103. The device of claim 102, wherein the first single-piece housing portion contacts the lower surface.

104. The device of claim 102, wherein the insulative housing consists of the first and second single-piece housing portions.

105. The device of claim 101, wherein the terminal is the only electrical conductor that extends through the top or bottom surfaces and is electrically connected to the pad.

106. The device of claim 101, wherein the terminal is within a periphery of the chip, and the lead is outside the periphery of the chip.

107. The device of claim 101, wherein the terminal is integral with a planar routing line that overlaps the lead and the pad and contacts the lead inside the insulative housing, outside a periphery of the terminal and outside a periphery of the chip.

108. The device of claim 101, wherein the device is devoid of an electrical conductor that extends through the top surface and is electrically connected to the pad.

109. The device of claim 101, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

110. The device of claim 101, wherein the device is devoid of wire bonds, TAB leads and solder joints.

111. A semiconductor package device, comprising:
an insulative housing with a top surface, a bottom surface, and a peripheral side surface between the top and bottom surfaces, wherein the insulative housing consists of a first single-piece housing portion that contacts the lower surface and the lead and is spaced from the terminal and a second single-piece housing portion that contacts the first single-piece housing portion and the terminal, and the first single-piece housing portion is not integral with the second single-piece housing portion;
a semiconductor chip within and surrounded by the insulative housing, wherein the chip includes an upper surface and a lower surface, the upper surface includes a conductive pad, the upper surface faces towards the bottom surface and faces away from the top surface;
a terminal that protrudes downwardly from and extends through the bottom surface and is spaced from the side surface and is electrically connected to the pad; and
a lead that protrudes laterally from and extends through the side surface and is electrically connected to the pad, wherein the lead includes a recessed portion that extends into the insulative housing and is spaced from the top and bottom surfaces and a non-recessed portion that extends outside the insulative housing and is adjacent to the recessed portion and contacts the insulative housing, the recessed and non-recessed portions each include four outer surfaces, three of the outer surfaces of the recessed and non-recessed portions that do not face in the same direction as the bottom surface are coplanar with one another where the recessed and non-recessed portions are adjacent to one another, one of the outer surfaces of the recessed and non-recessed portions that face in the same direction as the bottom surface are not coplanar with one another where the recessed and non-recessed portions are adjacent to one another, the terminal and the lead are spaced and separated from one another outside the insulative housing, and the terminal and the lead are electrically connected to one another inside the insulative housing and outside the chip.

112. The device of claim 111, wherein the second single-piece housing portion contacts the upper surface and is spaced from the lower surface.

113. The device of claim 112, wherein the first single-piece housing portion provides the top surface, the side surface and a peripheral portion of the bottom surface, and the second single-piece housing portion provides a central portion of the bottom surface within the peripheral portion of the bottom surface.

114. The device of claim 113, wherein the peripheral portion of the bottom surface is outside a periphery of the chip, and the central portion of the bottom surface is within and outside the periphery of the chip.

115. The device of claim 112, wherein the first single-piece housing portion is a transfer molded material, and the second single-piece housing portion is not a transfer molded material.

116. The device of claim 112, wherein the second single-piece housing portion includes first and second opposing surfaces, the first surface contacts the lead and the second surface provides a portion of the bottom surface.

117. The device of claim 111, wherein the terminal is within a periphery of the chip and outside a periphery of the pad, and the lead is outside the periphery of the chip.

118. The device of claim 111, wherein the terminal is integral with a planar routing line that overlaps the lead and the pad and contacts the lead inside the insulative housing, outside a periphery of the terminal and outside a periphery of the chip.

119. The device of claim 111, wherein the device includes a plurality of terminals and leads, the chip includes a plurality of pads, each of the terminals are electrically connected to one of the leads and one of the pads inside the insulative housing and outside the chip, the terminals are arranged as an array that protrudes downwardly from and extends through the bottom surface, and the leads are arranged as TSOP leads that protrude laterally from and extend through the side surface and an opposing peripheral side surface of the insulative housing.

120. The device of claim 111, wherein the device is devoid of were bonds, TAB leads and solder joints.

* * * * *

UNITED STATES PATENT AND TRADEMARK OFFICE
CERTIFICATE OF CORRECTION

PATENT NO. : 6,891,276 B1
DATED : May 10, 2005
INVENTOR(S) : Cheng-Lien Chiang

It is certified that error appears in the above-identified patent and that said Letters Patent is hereby corrected as shown below:

Column 27,
Line 14, change "TS OP" to -- TSOP --.

Column 30,
Line 38, change "load" to -- lead --.

Column 35,
Line 63, insert -- and -- after "pad,".

Column 36,
Line 63, change "were" to -- wire --.

Signed and Sealed this

Twelfth Day of July, 2005

JON W. DUDAS
*Director of the United States Patent and Trademark Office*